(12) United States Patent
Yu et al.

(10) Patent No.: US 9,195,331 B2
(45) Date of Patent: Nov. 24, 2015

(54) COMMON ELECTRODE CONNECTIONS IN INTEGRATED TOUCH SCREENS

(75) Inventors: Cheng-Ho Yu, Cupertino, CA (US); Zhibing Ge, Sunnyvale, CA (US); Ming Xu, Sunnyvale, CA (US); Shih Chang Chang, Cupertino, CA (US)

(73) Assignee: Apple Inc., Cupertino, CA (US)

(*) Notice: Subject to any disclaimer, the term of this patent is extended or adjusted under 35 U.S.C. 154(b) by 467 days.

(21) Appl. No.: 13/312,940

(22) Filed: Dec. 6, 2011

(65) Prior Publication Data

US 2013/0141343 A1 Jun. 6, 2013

(51) Int. Cl.
| G06F 3/041 | (2006.01) |
| G06F 3/044 | (2006.01) |
| G02F 1/1333 | (2006.01) |

(52) U.S. Cl.
CPC .............. *G06F 3/0412* (2013.01); *G06F 3/044* (2013.01); *G02F 1/13338* (2013.01); *H01L 2224/48137* (2013.01)

(58) Field of Classification Search
CPC ... G06F 3/044; G06F 3/0412; G02F 1/13338; H01L 2224/48137
USPC .................................................. 345/173, 175
See application file for complete search history.

(56) References Cited

U.S. PATENT DOCUMENTS

| 5,483,261 A | 1/1996 | Yasutake |
| 5,488,204 A | 1/1996 | Mead et al. |
| 5,825,352 A | 10/1998 | Bisset et al. |
| 5,835,079 A | 11/1998 | Shieh |
| 5,880,411 A | 3/1999 | Gillespie et al. |
| 6,188,391 B1 | 2/2001 | Seely et al. |
| 6,310,610 B1 | 10/2001 | Beaton et al. |
| 6,323,846 B1 | 11/2001 | Westerman et al. |
| 6,690,387 B2 | 2/2004 | Zimmerman et al. |
| 7,015,894 B2 | 3/2006 | Morohoshi |
| 7,184,064 B2 | 2/2007 | Zimmerman et al. |
| 7,663,607 B2 | 2/2010 | Hotelling et al. |

(Continued)

FOREIGN PATENT DOCUMENTS

| GB | 2 475 054 A | 5/2011 |
| JP | 2000-163031 A | 6/2000 |

(Continued)

OTHER PUBLICATIONS

International Search Report mailed Nov. 16, 2012, for PCT Application No. PCT/US2012/055654, three pages.

(Continued)

*Primary Examiner* — Sahlu Okebato
(74) *Attorney, Agent, or Firm* — Morrison & Foerster LLP

(57) ABSTRACT

Common electrodes (Vcom) of integrated touch screens can be segmented into electrically isolated Vcom portions that can be operated as drive lines and/or sense lines of a touch sensing system. The touch screen can include high-resistivity connections between Vcom portions. The resistivity of the high-resistivity connections can be high enough so that touch sensing and image display can be performed by the touch screen, and the high-resistivity connections can provide an added functionality by allowing a charge build up on one of the Vcom portions to be spread to other Vcom portions and/or discharged from system by allowing charge to leak through the high-resistivity connections. In this way, for example, visual artifacts that result from charge build up on a Vcom portion can be reduced or eliminated.

21 Claims, 20 Drawing Sheets

(56) References Cited

U.S. PATENT DOCUMENTS

| | | |
|---|---|---|
| 8,479,122 B2 | 7/2013 | Hotelling et al. |
| 2005/0276096 A1 | 12/2005 | Hara et al. |
| 2006/0026521 A1 | 2/2006 | Hotelling et al. |
| 2006/0103294 A1 | 5/2006 | Suzuki et al. |
| 2006/0197753 A1 | 9/2006 | Hotelling |
| 2007/0241660 A1 | 10/2007 | Suzuki et al. |
| 2008/0239196 A1* | 10/2008 | Morishita et al. ............ 349/58 |
| 2009/0058310 A1* | 3/2009 | Arai et al. ............... 315/169.4 |
| 2010/0194707 A1* | 8/2010 | Hotelling et al. ........... 345/173 |
| 2010/0253638 A1 | 10/2010 | Yousefpor et al. |
| 2010/0265235 A1 | 10/2010 | Lee |
| 2011/0050585 A1* | 3/2011 | Hotelling et al. ........... 345/173 |
| 2011/0052585 A1 | 3/2011 | Scaria et al. |
| 2011/0115733 A1 | 5/2011 | Shih et al. |
| 2011/0157039 A1 | 6/2011 | Shin et al. |
| 2011/0227095 A1* | 9/2011 | Treu et al. .................... 257/77 |
| 2011/0234523 A1 | 9/2011 | Chang et al. |
| 2011/0248949 A1 | 10/2011 | Chang et al. |
| 2013/0141348 A1 | 6/2013 | Jamshidi-Roudbari et al. |

FOREIGN PATENT DOCUMENTS

| | | |
|---|---|---|
| JP | 2002-342033 A | 11/2002 |
| JP | 2010-224215 A | 10/2010 |
| KR | 2011-0034871 A | 4/2011 |
| TW | 201101163 A | 1/2011 |
| TW | 201133319 A | 10/2011 |
| WO | WO-2013/085588 A1 | 6/2013 |
| WO | WO-2013/085603 A1 | 6/2013 |

OTHER PUBLICATIONS

International Search Report mailed Nov. 19, 2012, for PCT Application No. PCT/US2012/057643, four pages.

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.

Rubine, D.H. (May 1992). "Combining Gestures and Direct Manipulation," CHI '92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

Non-Final Office Action mailed Oct. 28, 2013, for U.S. Appl. No. 13/492,671, filed Jun. 8, 2012, 25 pages.

Search Report mailed Jul. 1, 2014, for ROC (Taiwan) Application No. 101135173, filed Sep. 25, 2012, with English Translation, two pages.

Search Report mailed Jun. 11, 2014, for ROC (Taiwan) Application No. 101136065, with English Translation, two pages.

Final Office Action mailed Jun. 20, 2014, for U.S. Appl. No. 13/492,671, filed Jun. 8, 2012, 19 pages.

Chinese Search Report mailed Jul. 2, 2015, for CN Application No. 201210367362.5, with English translation, four pages.

\* cited by examiner

COMMON ELECTRODE CONNECTIONS IN INTEGRATED TOUCH SCREENS

FIELD OF THE DISCLOSURE

This relates generally to integrated touch screens that include common electrode portions that can be operated as drive lines and/or sense lines, and in particular, to high-resistivity connections between the common electrode portions.

BACKGROUND OF THE DISCLOSURE

Many types of input devices are presently available for performing operations in a computing system, such as buttons or keys, mice, trackballs, joysticks, touch sensor panels, touch screens and the like. Touch screens, in particular, are becoming increasingly popular because of their ease and versatility of operation as well as their declining price. Touch screens can include a touch sensor panel, which can be a clear panel with a touch-sensitive surface, and a display device such as a liquid crystal display (LCD) that can be positioned partially or fully behind the panel so that the touch-sensitive surface can cover at least a portion of the viewable area of the display device. Touch screens can allow a user to perform various functions by touching the touch sensor panel using a finger, stylus or other object at a location often dictated by a user interface (UI) being displayed by the display device. In general, touch screens can recognize a touch and the position of the touch on the touch sensor panel, and the computing system can then interpret the touch in accordance with the display appearing at the time of the touch, and thereafter can perform one or more actions based on the touch. In the case of some touch sensing systems, a physical touch on the display is not needed to detect a touch. For example, in some capacitive-type touch sensing systems, fringing fields used to detect touch can extend beyond the surface of the display, and objects approaching near the surface may be detected near the surface without actually touching the surface.

Capacitive touch sensor panels can be formed from a matrix of drive and sense lines of a substantially transparent conductive material, such as Indium Tin Oxide (ITO), often arranged in rows and columns in horizontal and vertical directions on a substantially transparent substrate. It is due in part to their substantial transparency that capacitive touch sensor panels can be overlaid on a display to form a touch screen, as described above. Some touch screens can be formed by integrating touch sensing circuitry into a display pixel stackup (i.e., the stacked material layers forming the display pixels).

SUMMARY

This relates to integrated touch screens in which a common electrode (Vcom) of the display system can be segmented into electrically isolated Vcom portions that can be operated as drive lines and/or sense lines of a touch sensing system. The touch screen can include high-resistivity connections between Vcom portions. The resistivity of the high-resistivity connections can be high enough so that touch sensing and image display can be performed by the touch screen, and the high-resistivity connections can provide an added functionality by allowing a charge build up on one of the Vcom portions to be spread to other Vcom portions and/or discharged from system by allowing charge to leak through the high-resistivity connections. In this way, for example, visual artifacts that result from charge build up on a Vcom portion can be reduced or eliminated.

DETAILED DESCRIPTION

In the following description of example embodiments, reference is made to the accompanying drawings which form a part hereof, and in which it is shown by way of illustration specific embodiments in which embodiments of the disclosure can be practiced. It is to be understood that other embodiments can be used and structural changes can be made without departing from the scope of the embodiments of this disclosure.

This relates to integrated touch screens in which a common electrode (Vcom) of the display system can be segmented into electrically isolated Vcom portions that can be operated as drive lines and/or sense lines of a touch sensing system. The touch screen can include high-resistivity connections between Vcom portions. The resistivity of the high-resistivity connections can be high enough so that touch sensing and image display can be performed by the touch screen, and the high-resistivity connections can provide an added functionality by allowing a charge build up on one of the Vcom portions to be spread to other Vcom portions and/or discharged from system by allowing charge to leak through the high-resistivity connections. In this way, for example, visual artifacts that result from charge build up on a Vcom portion can be reduced or eliminated.

Figure 1C:
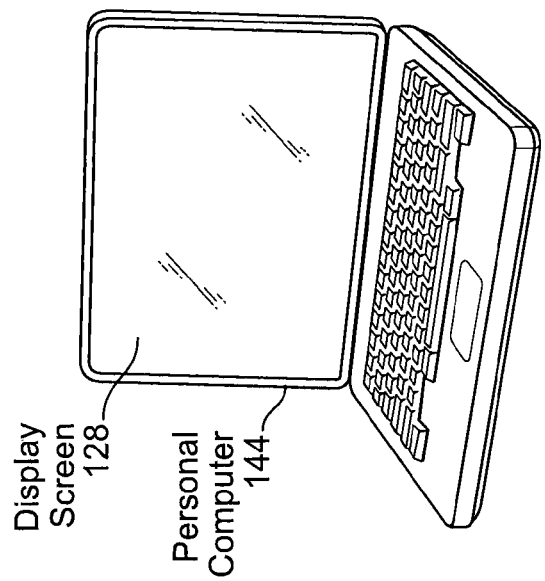
FIGS. 1A-1D illustrate an example mobile telephone, an example media player, an example personal computer, and an example display that each include an example display screen (which can be part of a touch screen) according to embodiments of the disclosure.
Figure 1B:
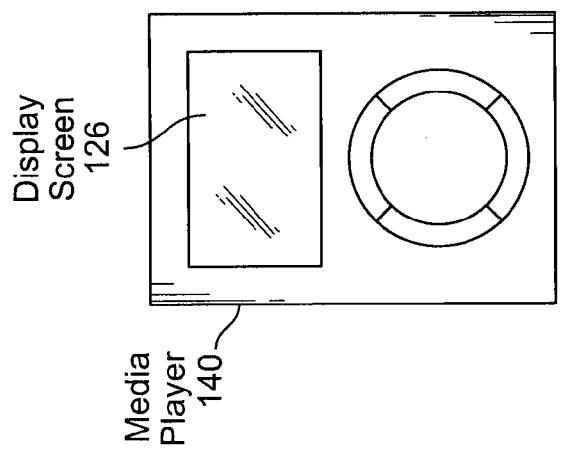
Figure 1A:
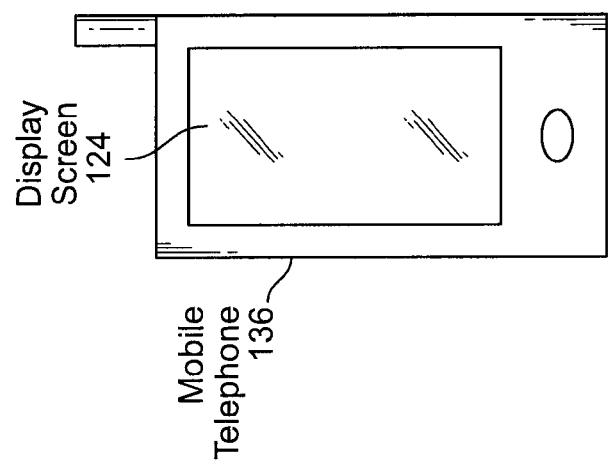

FIGS. 1A-1D show example systems in which display screens (which can be part of touch screens) according to embodiments of the disclosure may be implemented. FIG. 1A illustrates an example mobile telephone 136 that includes a display screen 124. FIG. 1B illustrates an example digital media player 140 that includes a display screen 126. FIG. 1C illustrates an example personal computer 144 that includes a display screen 128.

Figure 1D:
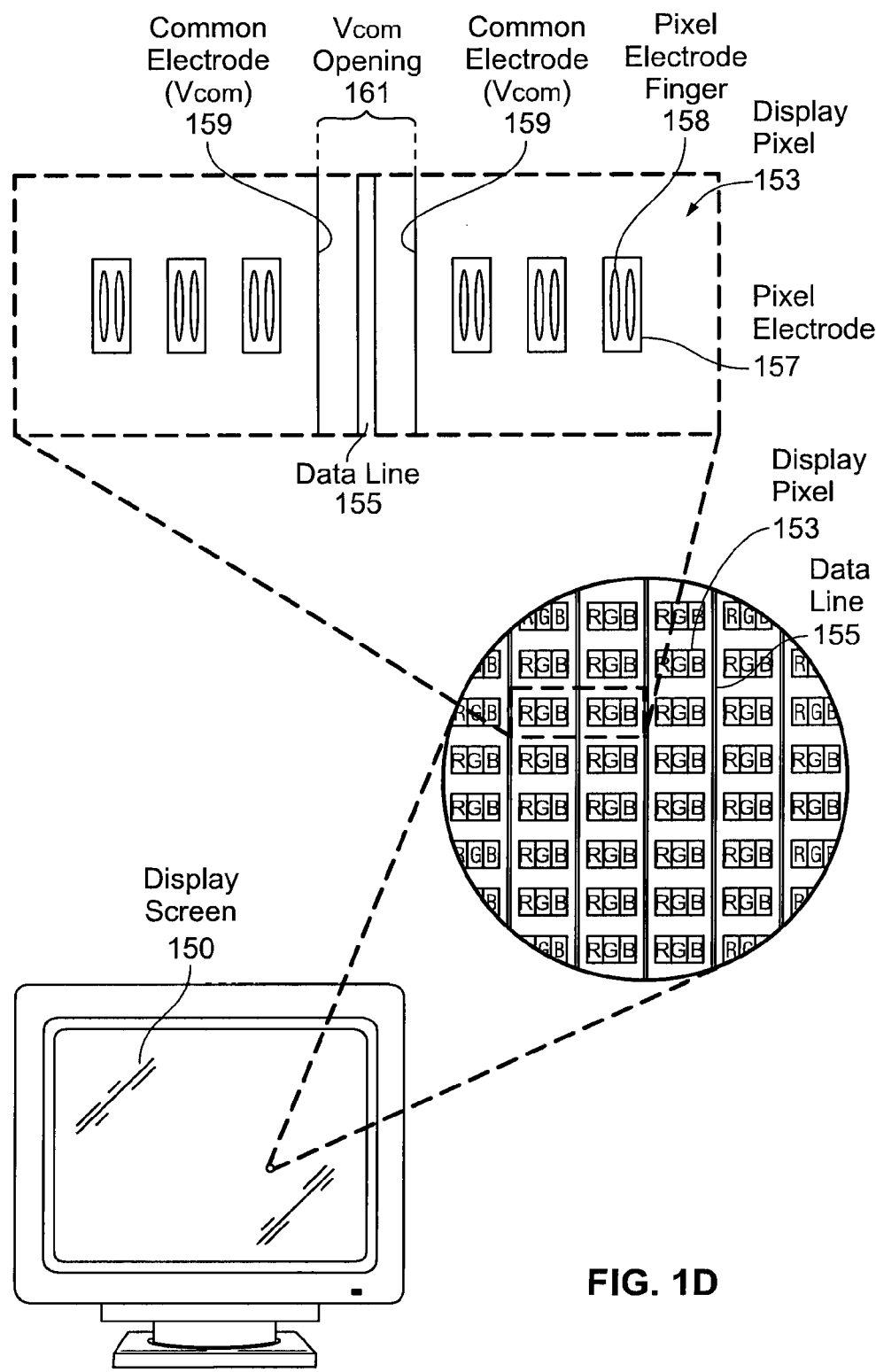

FIG. 1D illustrates some details of an example display screen 150. FIG. 1D includes a magnified view of display screen 150 that shows multiple display pixels 153, each of which can include multiple display sub-pixels, such as red (R), green (G), and blue (B) sub-pixels in an RGB display, for example. The magnified view also shows data lines 155 between each display pixel 153.

FIG. 1D also includes a magnified view of two of the display pixels 153, which illustrates that each display pixel can include pixel electrodes 157, each of which can correspond to one of the sub-pixels, for example. Each pixel electrode can include a plurality of pixel electrode fingers 158. Each display pixel can include a common electrode (Vcom) 159 that can be used in conjunction with pixel electrodes 157 to operate the display pixel, as will be described below in more detail. In this example embodiment, the Vcom 159 of adjacent display pixels 153 can be separated by an opening, Vcom opening 161. In this example embodiment, a single data line 155 can be used to operate all three pixel electrodes 157 in a display pixel 153, for example, by multiplexing the data line, while in other embodiments, the sub-pixels of a display pixel can be operated by separate data lines. In some embodiments, common electrodes can span multiple display pixels of the display screen, such as a single Vcom spanning a rectangular or other shape area of display pixels, and Vcom openings can be formed between these larger areas of Vcom.

During a display operation, voltages applied to the common electrodes and to the pixel electrodes can create an electric field through a pixel material (not shown), such as liquid crystal, of each display pixel. In the case of liquid crystal, for example, the electric field can cause inclination of the liquid crystal molecules that can control the amount of light from a backlight (not shown) that passes through a transparent cover (not shown), such as color filter glass. The amount of light passing through the color filter glass can be based on an amount of inclination of the liquid crystal, which can be based on the strength of the electric field through the liquid crystal. In this way, for example, controlling the strength of voltages applied to the liquid crystal of a display pixel can control the luminance of the display pixel. Other pixel materials that can control and/or generate light based on application of voltage to the pixel material could be used, as one skilled in the art would understand.

In some embodiments, display screens 124, 126, 128, and 150 can be touch screens in which touch sensing circuitry can be integrated into the display pixels. For example, in some embodiments, common electrodes such as Vcom 159 can be conductively connected together to form circuitry used by the touch sensing system. Touch sensing can be based on, for example, self-capacitance or mutual capacitance, or another touch sensing technology. For example, in a self-capacitance based touch system, an individual electrode with a self-capacitance to ground can be used to form a touch pixel for detecting touch. As an object approaches the touch pixel, an additional capacitance to ground can be formed between the object and the touch pixel. The additional capacitance to ground can result in a net increase in the self-capacitance seen by the touch pixel. This increase in self-capacitance can be detected and measured by a touch sensing system to determine the positions of multiple objects when they touch the touch screen. A mutual capacitance based touch system can include, for example, drive regions and sense regions, such as drive lines and sense lines. For example, drive lines can be formed in rows while sense lines can be formed in columns (e.g., orthogonal). Touch pixels can be formed at the "crossovers" or adjacencies of the rows and columns. It is understood that the drive and sense lines do not actually touch each other at the "cross-overs" or adjacencies, and for example, a dielectric layer, a break in a conductive path, etc., can be disposed between drive and sense lines at the "cross-overs" or adjacencies. During operation, the rows can be stimulated with an AC waveform and a mutual capacitance can be formed between the row and the column of the touch pixel. As an object approaches the touch pixel, some of the charge being coupled between the row and column of the touch pixel can instead be coupled onto the object. This reduction in charge coupling across the touch pixel can result in a net decrease in the mutual capacitance between the row and the column and a reduction in the AC waveform being coupled across the touch pixel. This reduction in the charge-coupled AC waveform can be detected and measured by the touch sensing system to determine the positions of multiple objects when they touch the touch screen. In some embodiments, a touch screen can be multi-touch, single touch, projection scan, full-imaging multi-touch, or any capacitive touch.

FIGS. 2-6 show example systems in which display screens with high-resistivity connections between common electrodes according to embodiments of the disclosure may be implemented.

Figure 2:
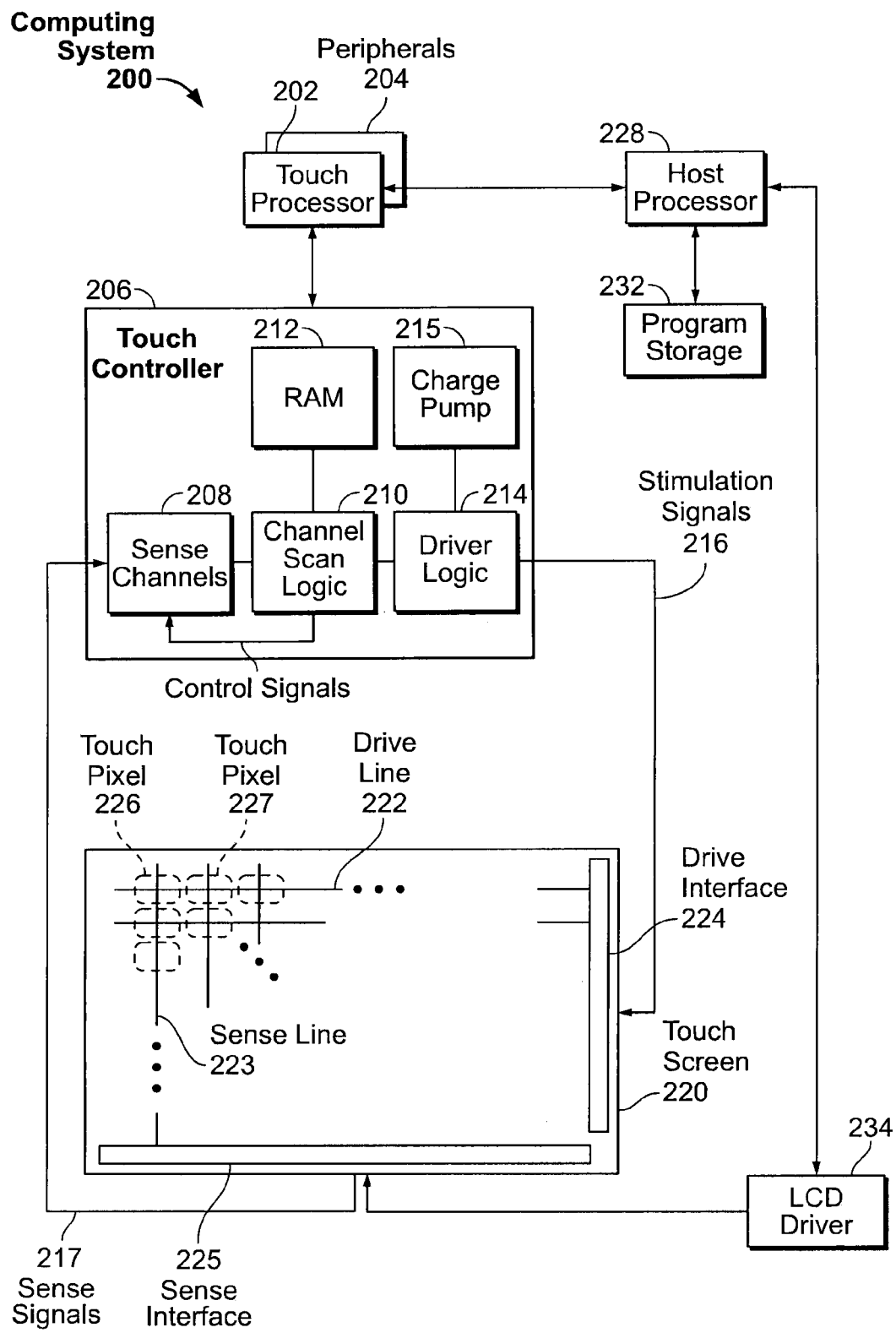
FIG. 2 is a block diagram of an example computing system that illustrates one implementation of an example touch screen according to embodiments of the disclosure.

100251 FIG. 2 is a block diagram of an example computing system 200 that illustrates one implementation of an example touch screen 220 according to embodiments of the disclosure. Computing system 200 could be included in, for example, mobile telephone 136, digital media player 140, personal computer 144, or any mobile or non-mobile computing device that includes a touch screen. Computing system 200 can include a touch sensing system including one or more touch processors 202, peripherals 204, a touch controller 206, and touch sensing circuitry (described in more detail below). Peripherals 204 can include, but are not limited to, random access memory (RAM) or other types of memory or storage, watchdog timers and the like. Touch controller 206 can include, but is not limited to, one or more sense channels 208, channel scan logic 210 and driver logic 214. Channel scan logic 210 can access RAM 212, autonomously read data from the sense channels and provide control for the sense channels. In addition, channel scan logic 210 can control driver logic 214 to generate stimulation signals 216 at various frequencies and phases that can be selectively applied to drive regions of the touch sensing circuitry of touch screen 220, as described in more detail below. In some embodiments, touch controller 206, touch processor 202 and peripherals 204 can be integrated into a single application specific integrated circuit (ASIC).

Computing system 200 can also include a host processor 228 for receiving outputs from touch processor 202 and performing actions based on the outputs. For example, host processor 228 can be connected to program storage 232 and a display controller, such as an LCD driver 234. Host processor 228 can use LCD driver 234 to generate an image on touch screen 220, such as an image of a user interface (UI), and can use touch processor 202 and touch controller 206 to detect a touch on or near touch screen 220, such a touch input to the displayed UI. The touch input can be used by computer programs stored in program storage 232 to perform actions that can include, but are not limited to, moving an object such as a cursor or pointer, scrolling or panning, adjusting control settings, opening a file or document, viewing a menu, making a selection, executing instructions, operating a peripheral device connected to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. Host processor 228 can also perform additional functions that may not be related to touch processing.

Touch screen 220 can include touch sensing circuitry that can include a capacitive sensing medium having a plurality of drive lines 222 and a plurality of sense lines 223. It should be noted that the term "lines" is sometimes used herein to mean simply conductive pathways, as one skilled in the art will readily understand, and is not limited to elements that are strictly linear, but includes pathways that change direction, and includes pathways of different size, shape, materials, etc. Drive lines 222 can be driven by stimulation signals 216 from driver logic 214 through a drive interface 224, and resulting sense signals 217 generated in sense lines 223 can be transmitted through a sense interface 225 to sense channels 208 (also referred to as an event detection and demodulation circuit) in touch controller 206. In this way, drive lines and sense lines can be part of the touch sensing circuitry that can interact to form capacitive sensing nodes, which can be thought of as touch picture elements (touch pixels), such as touch pixels 226 and 227. This way of understanding can be particularly useful when touch screen 220 is viewed as capturing an "image" of touch. In other words, after touch controller 206 has determined whether a touch has been detected at each touch pixel in the touch screen, the pattern of touch pixels in the touch screen at which a touch occurred can be thought of as an "image" of touch (e.g. a pattern of fingers touching the touch screen).

Figure 3:
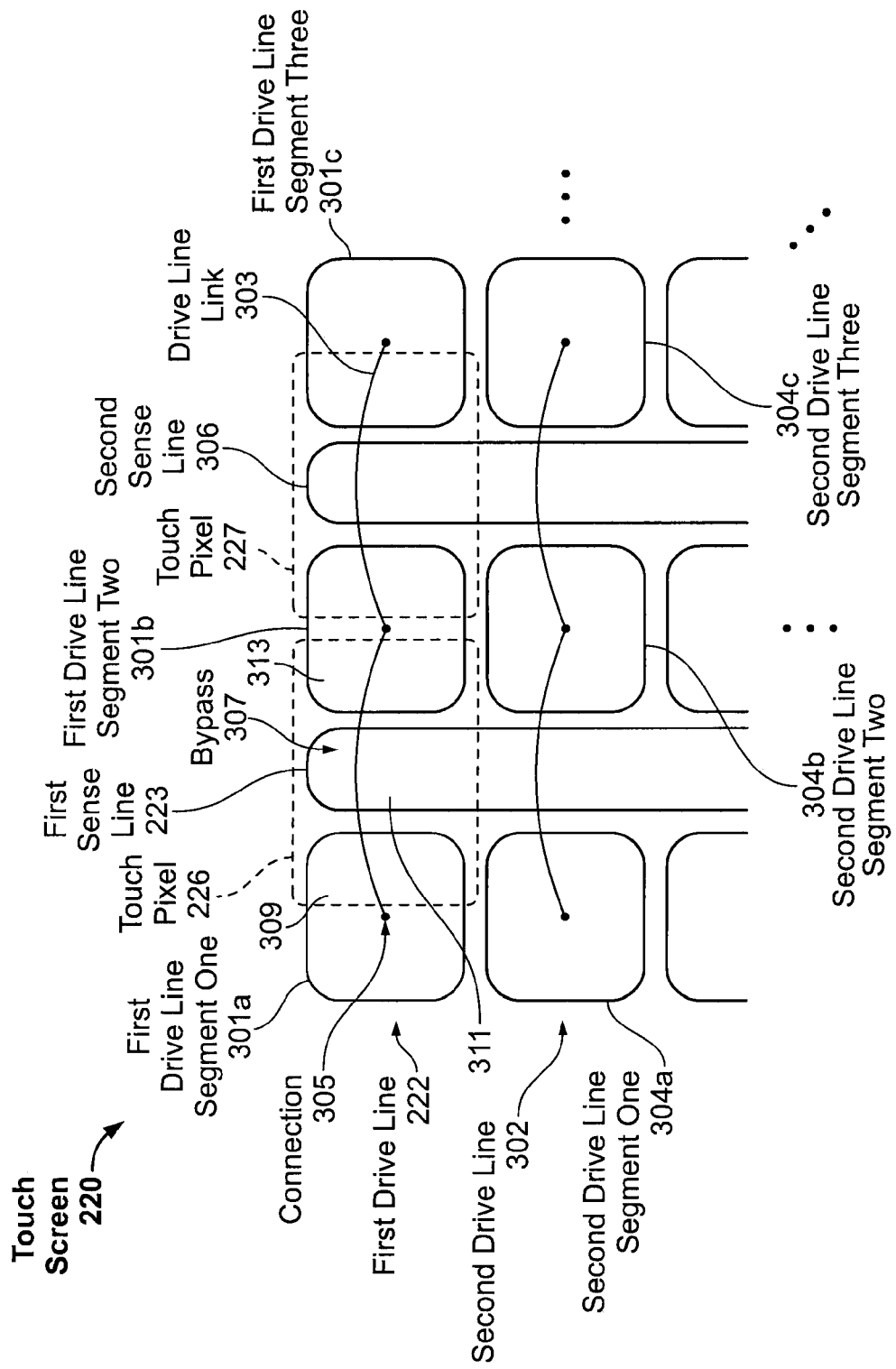
FIG. 3 is a more detailed view of the touch screen of FIG. 2 showing an example configuration of drive lines and sense lines according to embodiments of the disclosure.

In some example embodiments, touch screen 220 can be an integrated touch screen in which touch sensing circuit elements of the touch sensing system can be integrated into the display pixels stackups of a display. An example integrated touch screen in which embodiments of the disclosure can be implemented will now be described with reference to FIGS. 3-6. FIG. 3 is a more detailed view of touch screen 220 showing an example configuration of drive lines and sense lines according to embodiments of the disclosure. As shown in FIG. 3, each drive line can be formed of one or more drive line segments that can be electrically connected by drive line links that bypass the sense lines. For example, a first drive line 222 can include a first drive line segment one 301a, a first drive line segment two 301b, a first drive line segment three 301c, etc., that are electrically connected through drive line links 303 at connections 305. Likewise, a second drive line 302 can include a second drive line segment one 304a, a second drive line segment two 304b, a second drive line segment three 304c, etc., that are electrically connected through drive line links 303 at connections 305. Drive line links 303 are not electrically connected to the sense lines, such as a first sense line 223 and a second sense line 306, rather, the drive line links can bypass the sense lines through bypasses 307. The drive lines and the sense lines can interact capacitively to form touch pixels such as touch pixels 226 and 227. The drive lines (i.e., the drive line segments and corresponding drive line links) and the sense lines can be formed of electrical circuit elements in touch screen 220. In the example configuration of FIG. 3, each of touch pixels 226 and 227 can include a portion of one drive line segment, a portion of a sense line, and a portion of another drive line segment. For example, touch pixel 226 can include a right-half portion 309 of first drive line segment one 301a, a top portion 311 of first sense line 223, and a left-half portion 313 of first drive line segment two 301b.

The circuit elements can include, for example, elements that can exist in conventional LCD displays, as described above. It is noted that circuit elements are not limited to whole circuit components, such a whole capacitor, a whole transistor, etc., but can include portions of circuitry, such as only one of the two plates of a parallel plate capacitor.

Figure 4:
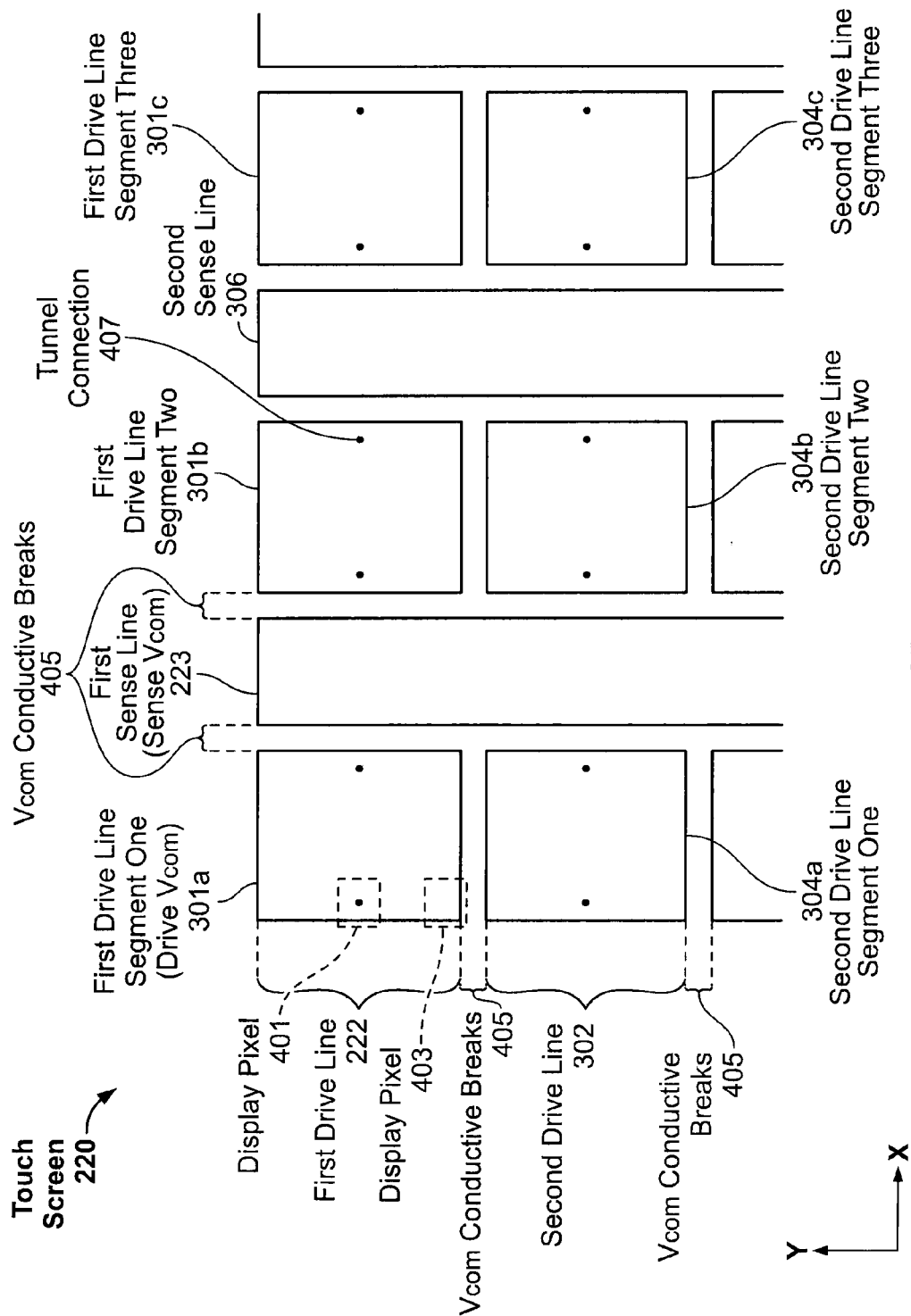
FIG. 4 illustrates an example configuration in which touch sensing circuitry includes common electrodes (Vcom) according to embodiments of the disclosure.
Figure 5:
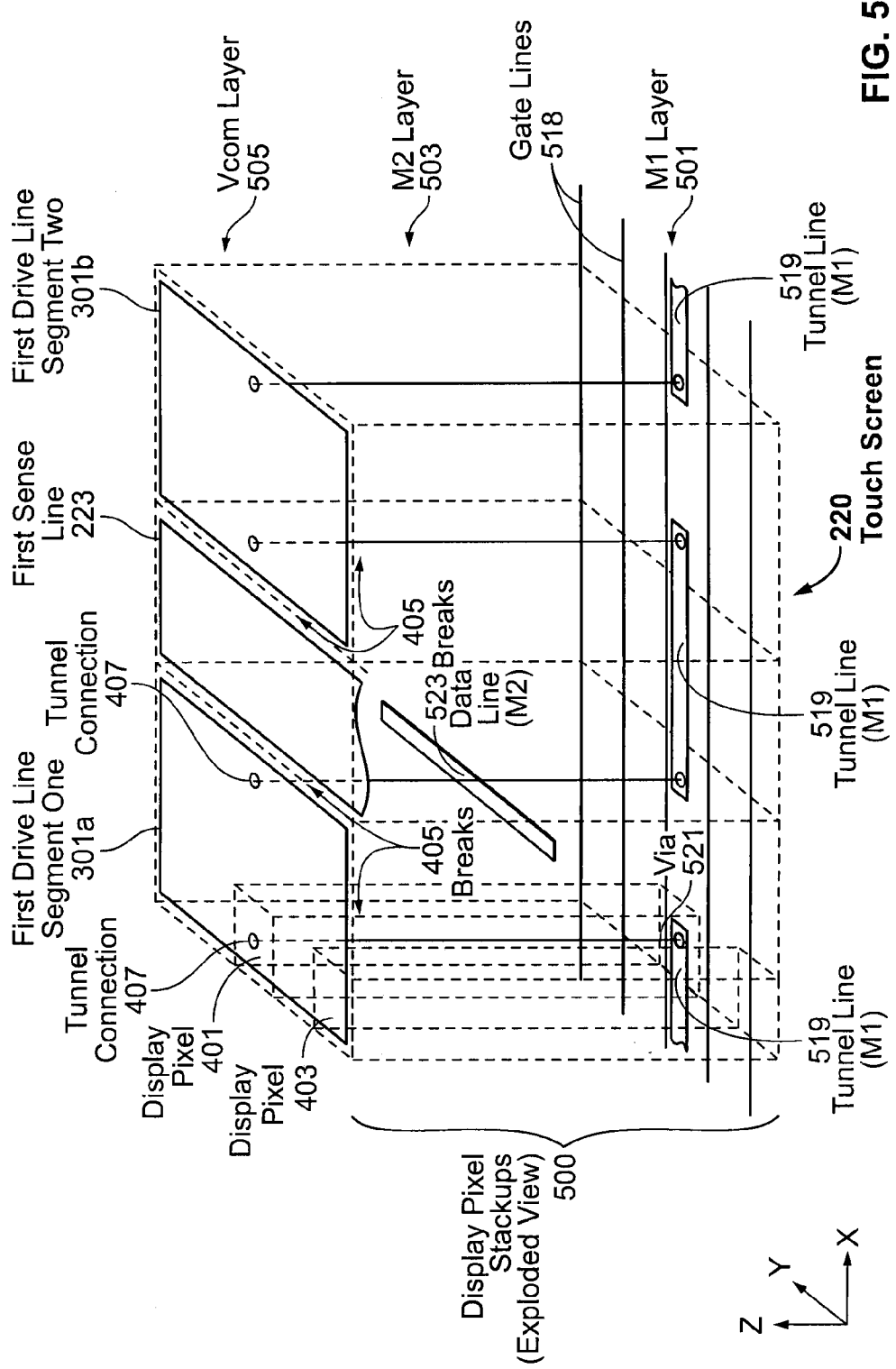
FIG. 5 illustrates an exploded view of display pixel stackups according to embodiments of the disclosure.

Referring to FIGS. 4-5, an example integrated touch screen configuration in which common electrodes (Vcom) can form portions of the touch sensing circuitry of a touch sensing system will now be described. Common electrodes are circuit elements of the display system circuitry in the pixel stackup (i.e., the stacked material layers forming the display pixels) of the display pixels of some types of conventional LCD displays, e.g., fringe field switching (FFS) displays; common electrodes can operate as part of the display system to display an image. FIG. 4 illustrates a plan view of a portion of the example touch screen, and FIG. 5 is a three-dimensional exploded view showing further details of the display pixel stackup.

In the example shown in FIGS. 4-5, each sense line can be formed of a single common electrode (also referred to as sense Vcom), and each drive line segment can be formed of a single common electrode (also referred to as drive Vcom). Each single common electrode can span multiple display pixels. For example, first drive line segment one 301a can be formed of a single common electrode that is shared by multiple display pixels, such as a display pixel 401 and a display pixel 403. For the sake of clarity, only two display pixels are illustrated, although it is to be understood that touch screen 220 can include many display pixels. Each single common electrode can be separated from other common electrodes by Vcom conductive breaks 405, which can be physical gaps between common electrodes. Thus, the drive Vcom of the drive lines can be conductively isolated from the sense Vcom of the sense lines. In other words, an electrical open can exist between the drive lines and the sense lines. Likewise, the drive Vcom of each drive line can be conductively isolated from the drive Vcom of the other drive lines.

Electrical charge that can build up on one of the conductively isolated portions of Vcom may create a charge imbalance among the portions of Vcom, which can result visual artifacts such as increases or decreases in brightness of the display pixels associated with the Vcom having the charge build up. Charge build up (i.e., positive charge or negative charge) can be caused by, for example, electrostatic discharge (ESD) that can occur during handling of device components by a person or machine in the manufacturing process, during shipping, during handling of the device by a user, during repair of the device, etc.

For example, a bonding machine used during manufacture may accidentally create an ESD when touching a conductive line connected to first drive line segment one 301a. As described above, the drive line segments of first drive line 222 can be conductively isolated from the other drive lines and the sense lines. The electrical opens existing between the drive lines and between the drive lines and sense lines can prevent the charge from the ESD from spreading from first drive line segment one 301a to the sense lines or spreading to other drive lines. However, the charge applied to first drive line segment one 301a can be distributed among all of the drive line segments of first drive line 222 through the drive line links that conductively connect together the drive line segments, as described above with reference to FIG. 3. In this regard, some of the display pixels in the drive line segments, such as display pixel 401, can include tunnel connections 407 that connect the drive Vcom of the display pixel's drive line segment to a conductive pathway that bypasses a sense line and connects to another drive line segment. The build up of charge on first drive line 222 due to the spreading of the ESD charge through drive line links can result in a visual artifact associated with the first drive line, such as the display pixels in the drive line segments of the first drive line appearing abnormally brighter than the other display pixels of touch screen 220. Various example embodiments that can reduce or eliminate such visual artifacts by distributing charge among all of the portions of Vcom in a touch screen and/or by reducing or removing charge build up using high-resistivity connections to Vcom portions will be described in more detail below with reference to FIGS. 7 and 10-19.

FIG. 5 shows further details of an example drive line link that includes a tunnel line that bypasses sense Vcom in an example touch screen according to various embodiments. FIG. 5 is a three-dimensional illustration of an exploded view (expanded in the z-direction) of example display pixel stackups 500 showing some of the elements within the pixel stackups of example integrated touch screen 220. Stackups 500 can include elements in a first metal (M1) layer 501, a second metal (M2) layer 503, and a common electrode (Vcom) layer 505. M1 layer 501 can include gate lines 518. M1 layer 501 can also include tunnel lines (also referred to as bypass lines) 519 that can electrically connect together drive line segments of a drive line through conductive vias 521 that connect the tunnel line to tunnel connections 407 in display pixels of two or more drive line segments. Tunnel line 519 can run through the display pixels of sense line 517 with no connections to the Vcom in the sense line, e.g., no vias 521 in display pixels of the sense line. One or more tunnel lines 519 can be used to connect drive line segments together. M2 layer 503 can include data lines 523, for example. Only one data line 523 is shown for the sake of clarity; however, a touch screen can include multiple data lines running through each vertical row of pixels.

Structures such as tunnel lines 519 and conductive vias 521 can operate as a touch sensing circuitry of a touch sensing system to detect touch during a touch sensing phase of the touch screen. Structures such as data lines 523, along with other pixel stackup elements such as transistors, pixel electrodes, common voltage lines, etc. (not shown), can operate as display circuitry of a display system to display an image on the touch screen during a display phase. Structures such as the drive Vcom of the drive line segments and the sense Vcom of the sense lines can operate as multifunction circuit elements that can operate as part of both the touch sensing system and the display system.

For example, in operation during a touch sensing phase, stimulation signals (also referred to as drive signals) can be transmitted through a drive line, e.g., the drive line segments connected by tunnel lines 519 and conductive vias 521, to form electric fields between the stimulated drive line segments and the sense lines to create touch pixels, such as touch pixel 226 in FIG. 2. In this way, the connected together drive line segments can operate as a drive line, such as drive line 222. When an object such as a finger approaches or touches a touch pixel, the object can affect the electric fields extending between the drive line segments and the sense line, thereby reducing the amount of charge capacitively coupled to the sense region. This reduction in charge can be sensed by a sense channel of a touch sensing controller connected to the touch screen, such as touch controller 206 shown in FIG. 2, and stored in a memory along with similar information of other touch pixels to create an "image" of touch.

Figure 6:
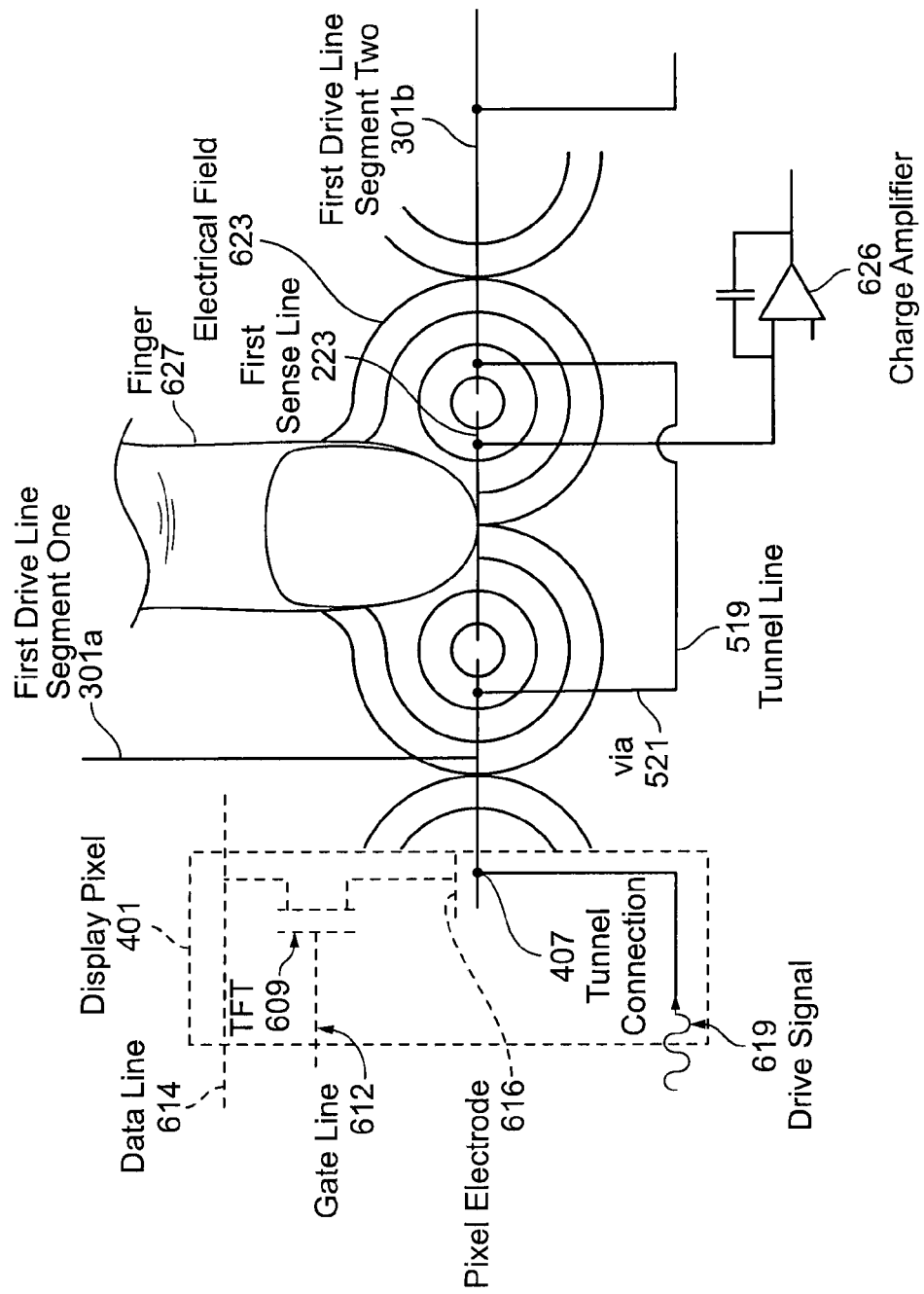
FIG. 6 illustrates an example touch sensing operation according to embodiments of the disclosure.

A touch sensing operation according to embodiments of the disclosure will be described with reference to FIG. 6. FIG. 6 shows partial circuit diagrams of some of the touch sensing circuitry associated with first drive line 222, including first drive line segment one 301a and first drive line segment two 301b, and first sense line 223 according to embodiments of the disclosure. FIG. 6 also shows further details of circuit elements of display pixel 401. For the sake of clarity, FIG. 6 includes circuit elements illustrated with dashed lines to signify some circuit elements operate primarily as part of the display circuitry and not the touch sensing circuitry. Display pixel 401 can include a TFT 609, a gate line 612, a data line 614, a pixel electrode 616, and a common electrode 618.

During a touch sensing phase, a drive signal 619, such as an alternating current (AC) drive signal, can be applied to the drive line segments of drive line 222 through tunnel lines 519 and conductive vias 521 that connect the drive line segments together. Drive signal 619 can generate electrical fields 623 between the drive line segments and the sense lines. For example, electrical fields 623 can be generated between first drive line segment one 301a and first sense line 223, and between first drive line segment two 301b and the first sense line. The first sense line can be connected to a sense amplifier, such as a charge amplifier 626. Thus, drive signal 619 can inject electrical charge into first sense line 223, and charge amplifier 626 can convert the injected charge into a voltage that can be measured. The amount of charge injected, and consequently the measured voltage, can depend on the proximity of a touch object, such as a finger 627, to the corresponding region of the touch screen, i.e., touch pixel 226. In this way, the measured voltage can provide an indication of touch on or near the touch screen.

Figure 7:
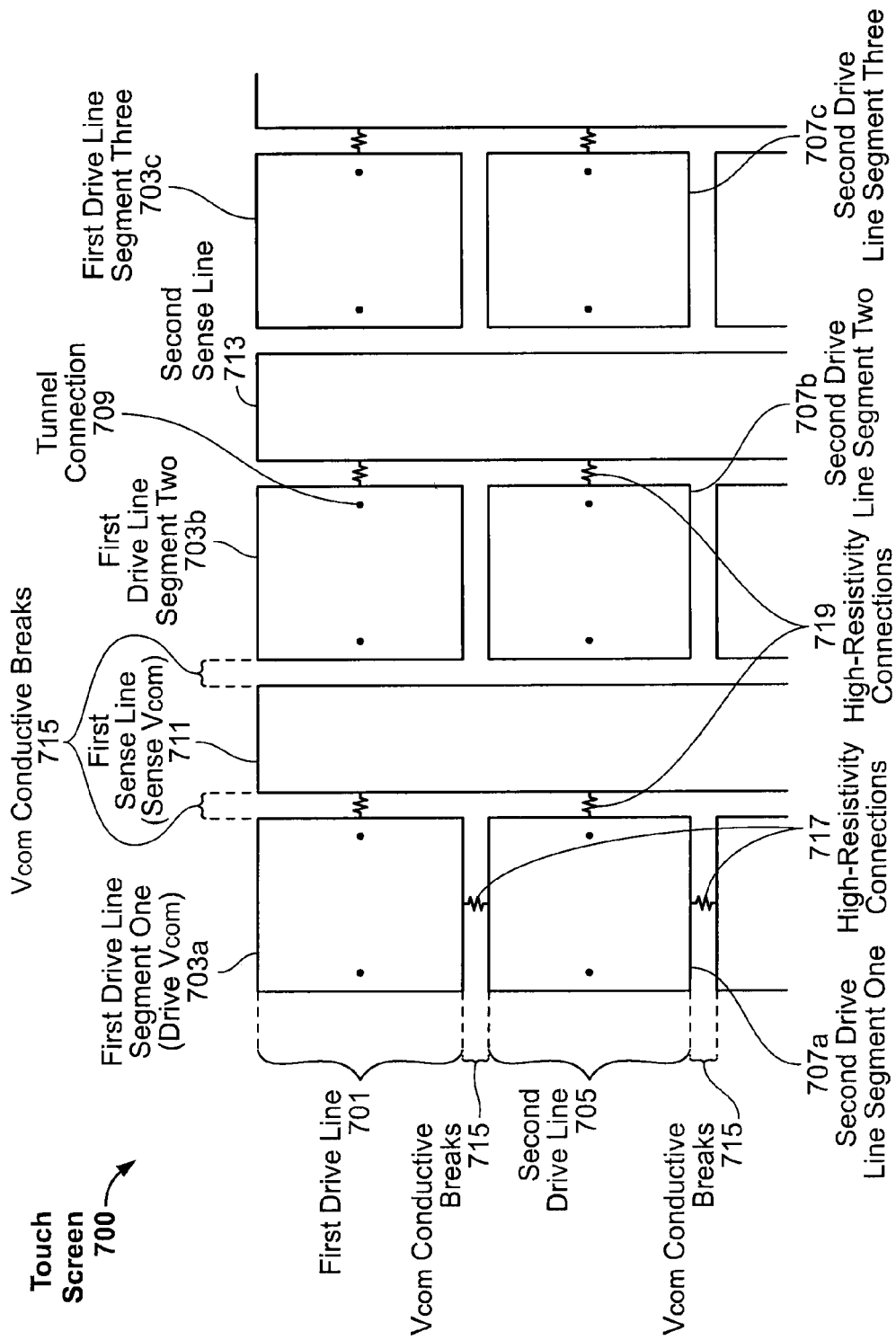
FIG. 7 illustrates of an example integrated touch screen configuration including high-resistivity connections between Vcom portions according to various embodiments.

FIG. 7 illustrates of an example integrated touch screen configuration including high-resistivity connections between Vcom portions according to various embodiments. A touch screen 700 can include drive lines including drive Vcom segments and sense lines including sense Vcom, similar to the configuration of example touch screen 220 illustrated in FIG. 4. Touch screen 700 can include a first drive line 701 that includes drive Vcom portions including a first drive line segment one 703a, a first drive line segment two 703b, and a first drive line segment three 703c. A second drive line 705 can include a second drive line segment one 707a, a second drive line segment two 707b, and a second drive line segment three 707c. The drive line segments in each drive line can be conductively connected together through tunnel connections 709 that connect the drive Vcom in each drive line segment to a tunnel line (not shown) such as tunnel line 519. Touch screen 700 can include a first sense line 711 and a second sense line 713 that each includes a sense Vcom portion. Vcom openings can create Vcom conductive breaks 715 between the drive lines and the sense lines, and between the drive lines.

Touch screen 700 can include high-resistivity connections that can conductively connect Vcom portions across a Vcom conductive break 715. As used herein, a high-resistivity connection is a connection between two or more Vcom portions, where the connection has an electrical resistance that is high enough to allow the Vcom portions to operate as separate circuit elements of the touch sensing system, e.g., a drive line or a sense line, and where the electrical resistance is low enough to allow electrical charge to leak through the connection as a direct electrical current. In the example touch sensing operation described above with reference to FIG. 6, a high-resistivity connection between a drive Vcom portion of a drive line and a sense Vcom portion of a sense line would have an electrical resistance high enough to allow drive signal 619 to generate electric field 623 between the drive line and the sense line such that a touch object can be sensed as described above.

Referring to FIG. 7, some connections, such as high-resistivity connections 717, can conductively connect together two drive lines. In the example configuration of FIG. 7, a single high-resistivity connection 717 between first drive line segment one 703a and second drive line segment one 707a can conductively connect all of the drive line segments of first drive line 701 and all of the drive line segments of second drive line 705. Other connections, such as high-resistivity connections 719, can conductively connect together a drive line and a sense line. In the example configuration of FIG. 7, a single high-resistivity connection between first drive line segment one 703a and first sense line 711 can conductively connect all of the drive line segments of the first drive line to the first sense line. Likewise, a single high-resistivity connection 719 between first drive line segment two 703b and second sense line 713 can conductively connect all of the drive line segments of the first drive line to the second sense line. Therefore, some of the charge in a charge build up on any portion of Vcom in touch screen 700 can leak through one or more high-resistivity connections to spread the charge throughout all of the portions of Vcom.

Distributing a charge build up across all Vcom portions can reduce the appearance of visual artifacts in two ways. First, the amount of charge that builds up on a single Vcom portion, due to an ESD on that Vcom portion, for example, can be reduced because the charge can leak out to other Vcom portions. Thus, the amount of localized charge can be reduced, which can reduce the severity of a local visual artifact associated with the Vcom portion initially receiving the ESD. Second, the charge can be distributed evenly among all Vcom portions, which can result a uniform display error, such as a uniform increase or decrease in brightness of all display pixels. A uniform increase or decrease in brightness can be much harder to detect as a visual artifact than a localized increase or decrease in brightness. In sum, distributing a charge build up can result in a smaller, more uniform display error, which can result in a reduced or undetectable visual artifact.

In example touch screen 700, each high-resistivity connection can be an exclusive high-resistivity connection between two conductively isolated Vcom portions. As used herein, an exclusive high-resistivity connection between two conductively isolated Vcom portions is a high-resistivity connection through which charge can flow only from one Vcom portion to the other Vcom portion, or vice versa. It is to be noted that once the charge has flowed from one Vcom portion to the other Vcom portion through the exclusive high-resistivity connection, it is possible that the charge may be leaked from the other Vcom portion into one or more additional conductively isolated Vcom portions through one or more additional high-resistivity connections that may exist. For example, electrical charge flowing from first sense line 711 through high-resistivity connection 719 between the first sense line and drive line segment one 703a can only flow into the first drive line segment one, and vice versa. Accordingly, high-resistivity connection 719 between first sense line 711 and first drive line segment one 703a is an exclusive high-resistivity connection.

In example touch screen 700, the high-resistivity connections can be, for example, conductive pathways that include a high-resistivity material. In some embodiments, the high-resistivity material can be formed in the same layer of the pixel stackup as the Vcom portions. In some embodiments, the high-resistivity material can be formed in a different layer as the Vcom portions, and can be connected to the Vcom portions through vias, for example.

One skilled in the art would readily understand that more or fewer high-resistivity connections and/or different configurations of high-resistivity connections can be used. For example, some embodiments can include only high-resistivity connections between the drive lines and the sense lines, such as high-resistivity connections 719, and may not include high-resistivity connections between drive line segments, such as high-resistivity connections 717. In these embodiments, charge on one of the drive lines can be leaked to each sense line through one high-resistivity connection, and leaked to another drive line through two high-resistivity connections in series. Compared to the example configuration illustrated in FIG. 7, some embodiments can include additional high-resistivity connections. For example, some embodiments can include a high-resistivity connection at every Vcom conductive break between two Vcom portions. In this way, for example, multiple parallel conductive pathways can be provided, which can allow a localized charge build up to be more quickly distributed among the Vcom portions.

Figure 8:
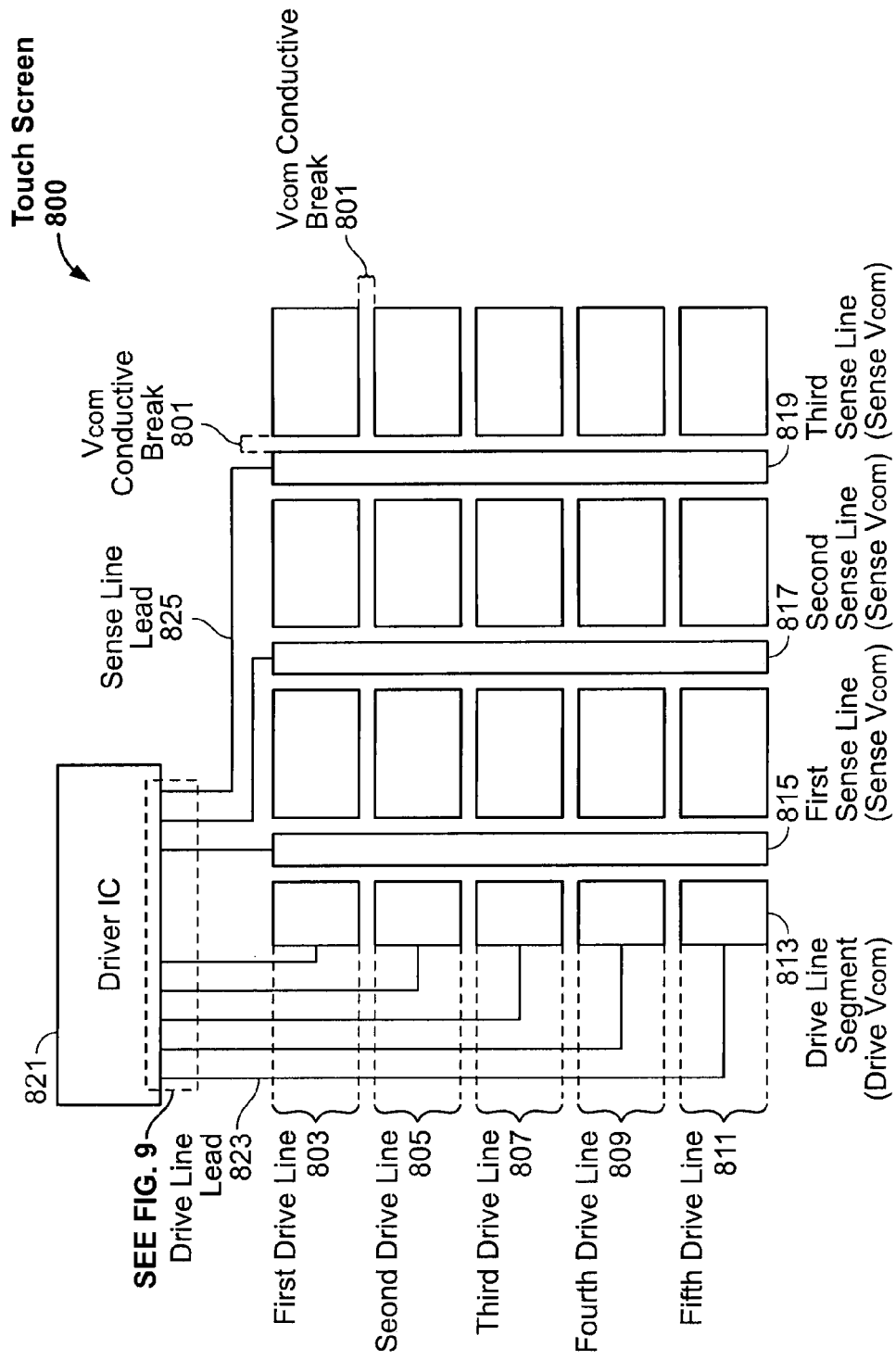
FIGS. 8-9 illustrate an example integrated touch screen configuration in which various embodiments can be implemented.
Figure 9:
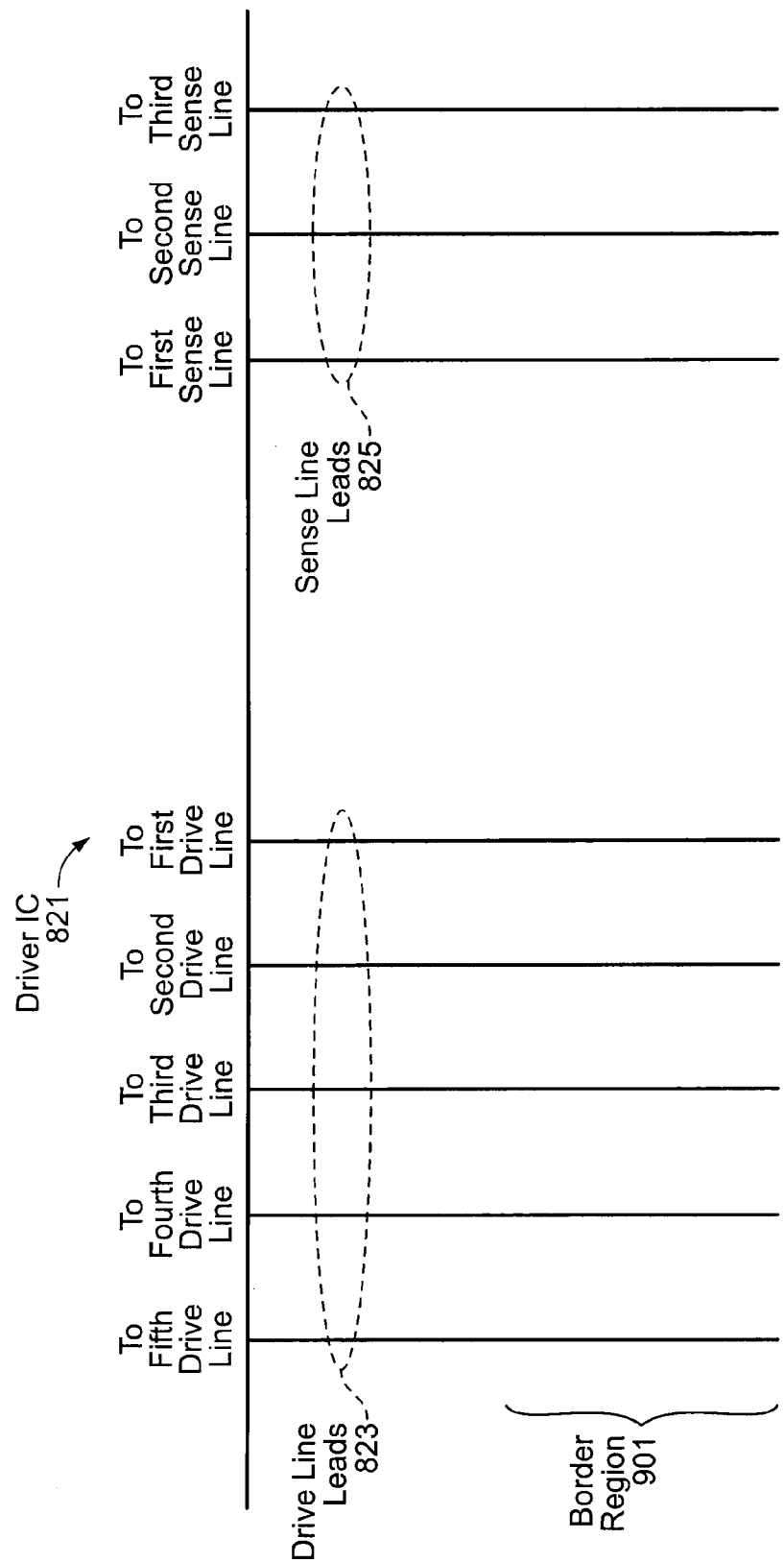

FIGS. 8-9 illustrate an example integrated touch screen configuration in which various embodiments can be implemented. An integrated touch screen 800 can include a display pixel stackup with a common electrode layer including Vcom conductive breaks 801 between multiple Vcom portions, which can be configured into drive lines and sense lines, for example, as in example touch screen 220 described above. Each of a first drive line 803, a second drive line 805, a third drive line 807, a fourth drive line 809, and a fifth drive line 811 can include multiple drive line segments 813 conductively connected together with drive line links (not shown). A first sense line 815, a second sense line 817, and a third sense line 819 can each include a single Vcom portion. Each drive line can electrically connected to a driver integrated circuit (IC) 821 through a drive line lead 823, and each sense line can be electrically connected to the driver IC through a sense line lead 825. Drive line leads 823 and sense line leads 825 can be conductive wires that can carry drive signals from driver IC 821 to the drive lines and carry sense signals from the sense lines to the driver IC, respectively. Driver IC 821 can control the touch sensing operation of the drive lines and sense lines, for example, as in the example touch sensing operation described above in reference to FIG. 6. In some embodiments, driver IC 821 can also control the display operation of touch screen 800 to display images on the touch screen.

FIG. 9 shows portions of driver IC 821, drive line leads 823, and sense line leads 825 in greater detail. In this example embodiment, drive line leads 823 and sense line leads 825 can run through a border region 901 of touch screen 800. Border region 901 can be a region bordering the active display and touch sensing area of touch screen 800 and can include circuit elements, such as conductive lines, switches, busses, etc., that can connect the display and touch sensing circuitry in the active area to one or more devices that can control the circuitry to display images and/or sense touches on the touch screen, such as driver IC 821. In some embodiments, circuit elements in border region 901 can be formed on the same substrate as the circuit elements in the active area. For example, the stackup of display pixels can be formed on silicon dioxide substrate using semiconductor manufacturing processes such as masking, depositing material layers, etching, doping, etc. In some embodiments, the silicon dioxide substrate can extend beyond the active area to create a border region, and circuit elements can be formed in the border region using the same semiconductor manufacturing processes.

Figure 10:
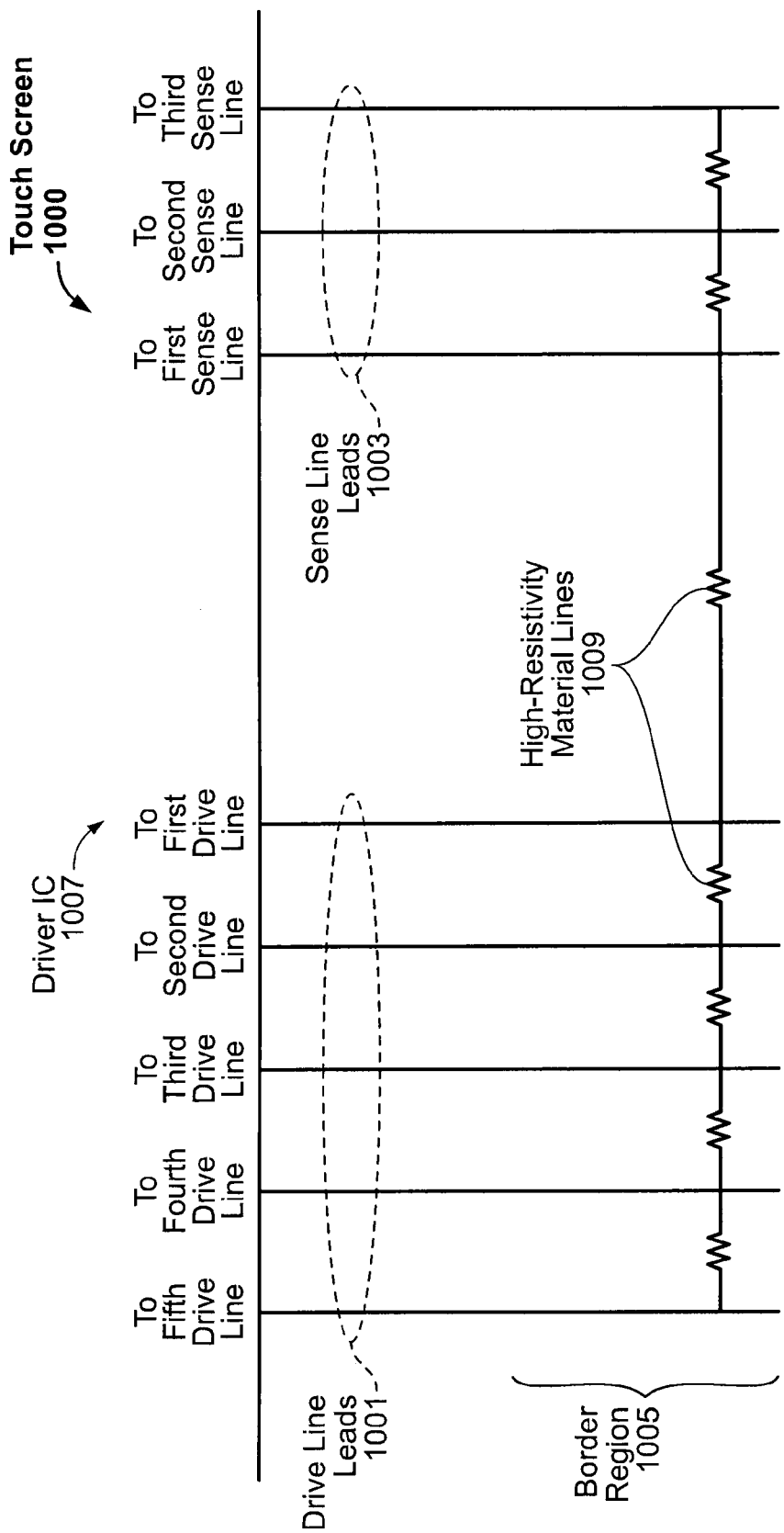
FIGS. 10-17 illustrate example touch screens according to various embodiments.

FIG. 10 illustrates a portion of a border region of an example touch screen according to various embodiments. A touch screen 1000 can include an active area with drive lines and sense lines (not shown) configured as described in example touch screen 800. Drive line leads 1001 and sense line leads 1003 can be configured as drive line leads 823 and sense line leads 825, respectively, and can run through a border region 1005 of touch screen 1000. A driver IC 1007 can be configured as driver IC 821 and can control the touch sensing operation of touch screen 1000.

Touch screen 1000 can include high-resistivity connections, such as high-resistivity material lines 1009, which can be conductive pathways that include a high-resistivity material. Each high-resistivity material line 1009 can connect together two drive line leads 1001, two sense line leads 1003, or a drive line lead and a sense line lead. Consequently, a charge build up on the Vcom of one of the drive or sense lines can be spread to each of the other drive and sense lines by leaking through one or more high-resistivity material lines 1009. For example, charge from a charge build up on the fifth drive line can leak through a single high-resistivity material line 1009 into the fourth drive line, can leak through two high-resistivity material lines 1009 into the third drive line, etc . . . , and can leak through seven high-resistivity material lines 1009 into the third sense line.

Figure 11:
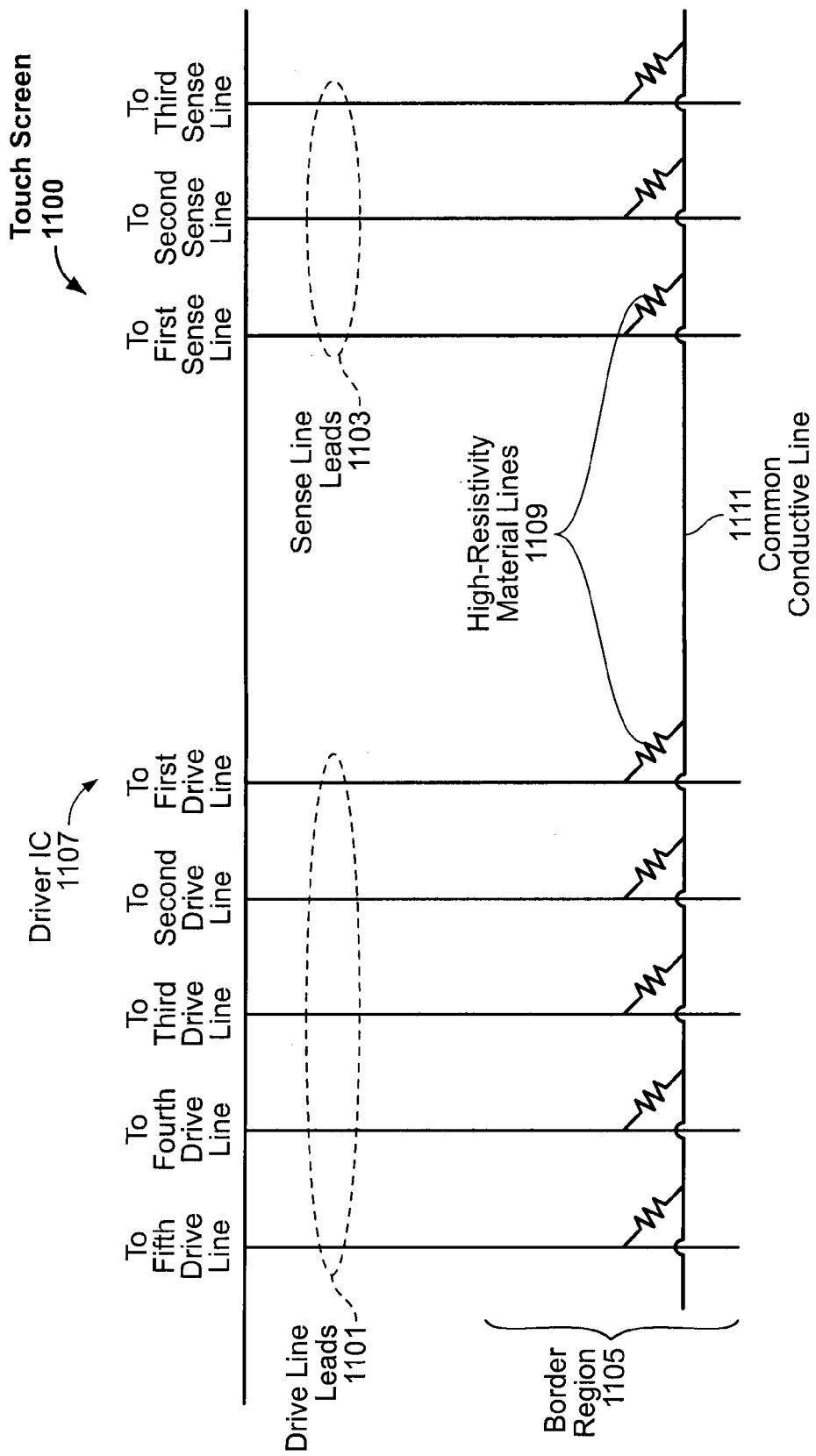

FIG. 11 illustrates a portion of a border region of an example touch screen according to various embodiments. A touch screen 1100 can include an active area with drive lines and sense lines (not shown) configured as described in example touch screen 800. Drive line leads 1101 and sense line leads 1103 can be configured as drive line leads 823 and sense line leads 825, respectively, and can run through a border region 1105 of touch screen 1100. A driver IC 1107 can be configured as driver IC 821 and can control the touch sensing operation of touch screen 1100.

Touch screen 1100 can include high-resistivity connections, such as high-resistivity material lines 1109, which can be conductive pathways that include a high-resistivity material. Each high-resistivity material line 1109 can connect a single drive line lead 1101 to a common conductive line 1111, or can connect a single sense line lead 1103 to the common conductive line. In other words, common conductive line can be a common node that connects to each of multiple electrically isolated Vcom portions (e.g., drive lines and sense lines) through a high-resistivity connection (e.g., a high-resistivity material line 1109). Consequently, a charge build up on the Vcom of one of the drive or sense lines can be spread to each of the other drive and sense lines by leaking through two high-resistivity material lines 1009. For example, charge from a charge build up on the fifth drive line can leak into the fourth drive line by leaking through high-resistivity material line 1109 connecting the fifth drive line lead to common conductive line 1111 and then leaking through high-resistivity material line 1109 connecting the fourth drive line lead to the common conductive line. Likewise, charge on any of the drive lines or sense lines can leak into any other drive line or sense line by leaking through two high-resistivity material lines 1109 connected by common conductive line 1111.

Figure 12:
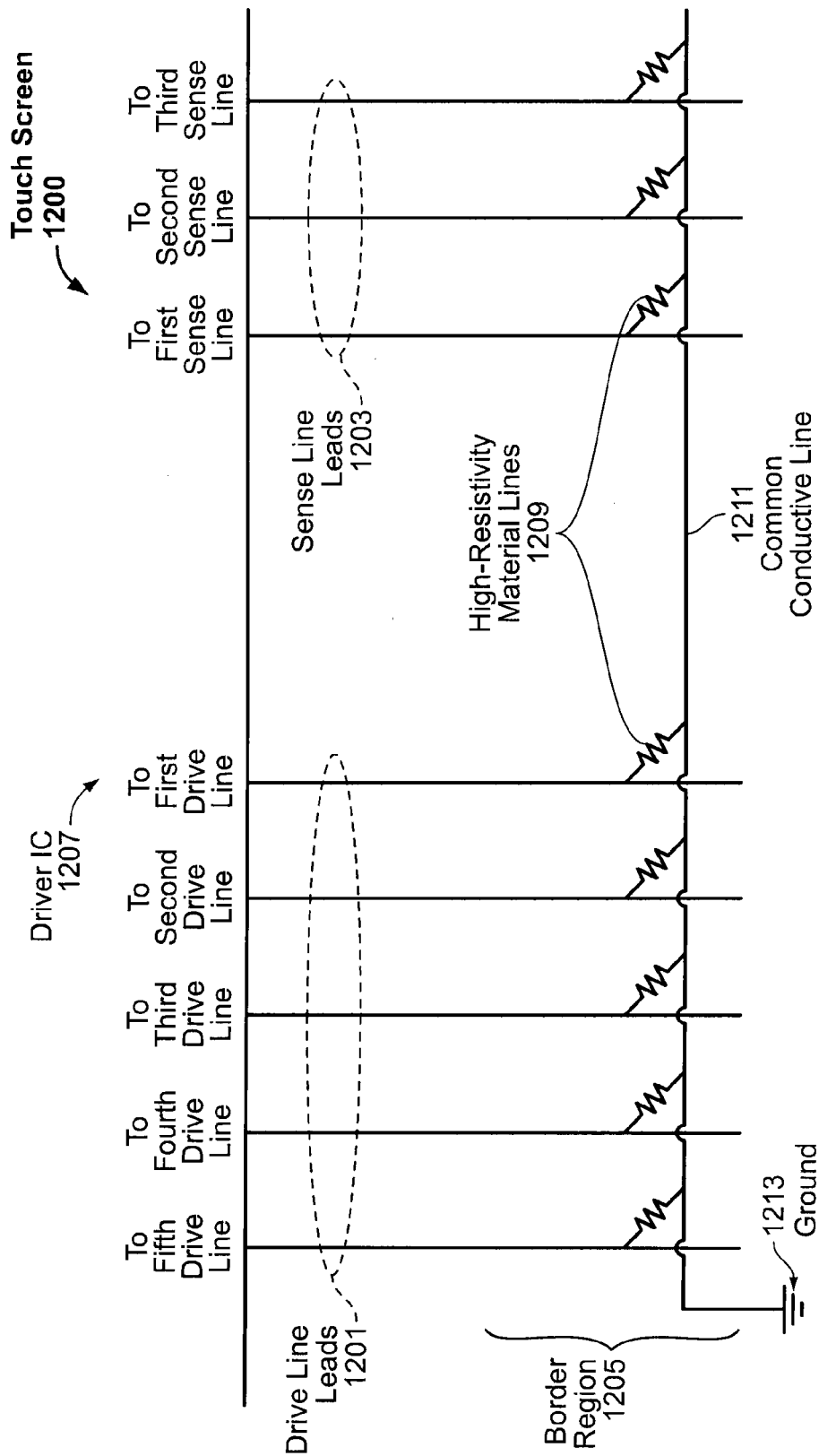
Figure 13:
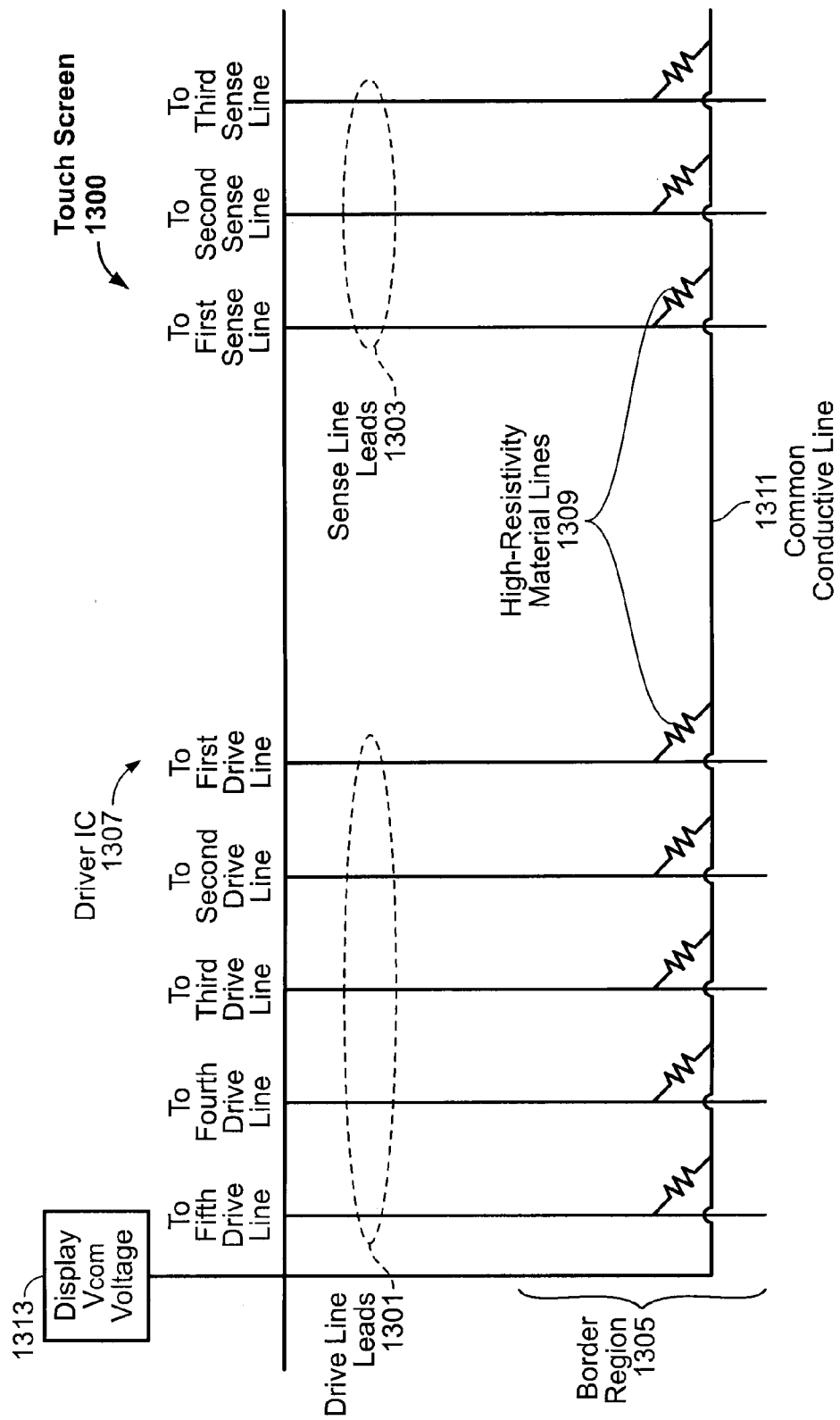

In this example configuration of FIG. 11, common conductive line 1111 can be electrically isolated from other circuit elements of touch screen 1100. FIGS. 12-13 illustrate example configurations in which a common conductive line can be additionally connected to various other circuit elements.

FIG. 12 illustrates a portion of a border region of an example touch screen according to various embodiments. A touch screen 1200 can include an active area with drive lines and sense lines (not shown) configured as described in example touch screen 800. Drive line leads 1201 and sense line leads 1203 can be configured as drive line leads 823 and sense line leads 825, respectively, and can run through a border region 1205 of touch screen 1200. A driver IC 1207 can be configured as driver IC 821 and can control the touch sensing operation of touch screen 1200.

Touch screen 1200 can include high-resistivity connections, such as high-resistivity material lines 1209, which can be conductive pathways that include a high-resistivity material. Each high-resistivity material line 1209 can connect a single drive line lead 1201 to a common conductive line 1211, or can connect a single sense line lead 1203 to the common conductive line. Common conductive line 1211 can be connected to an electrical ground 1213, such as a chassis ground, an earth ground, etc. Consequently, a charge build up on the Vcom of any of the drive lines or sense lines can be leaked through a single high-resistivity material line 1209 and flow through common conductive line 1211 into ground 1213. In this way, for example, a charge build up on one, multiple, or all of the drive lines and/or sense lines can be reduced or eliminated.

FIG. 13 illustrates a portion of a border region of an example touch screen according to various embodiments. A touch screen 1300 can include an active area with drive lines and sense lines (not shown) configured as described in example touch screen 800. Drive line leads 1301 and sense line leads 1303 can be configured as drive line leads 823 and sense line leads 825, respectively, and can run through a border region 1305 of touch screen 1300. A driver IC 1307 can be configured as driver IC 821 and can control the touch sensing operation of touch screen 1300.

Touch screen 1300 can include high-resistivity connections, such as high-resistivity material lines 1309, which can be conductive pathways that include a high-resistivity material. Each high-resistivity material line 1309 can connect a single drive line lead 1301 to a common conductive line 1311, or can connect a single sense line lead 1303 to the common conductive line. Common conductive line 1311 can be connected to a display Vcom voltage 1313. A voltage level of display Vcom voltage 1313 can be the voltage level applied to the Vcom during the display phase to display an image on touch screen 1300. Consequently, a charge build up on the Vcom of one of the drive or sense lines of touch screen 1300 can be spread to each of the other drive and sense lines by leaking through two high-resistivity material lines 1309, while display Vcom voltage 1313 can help maintain the desired voltage level on the Vcom portions of touch screen 1300.

Figure 14:
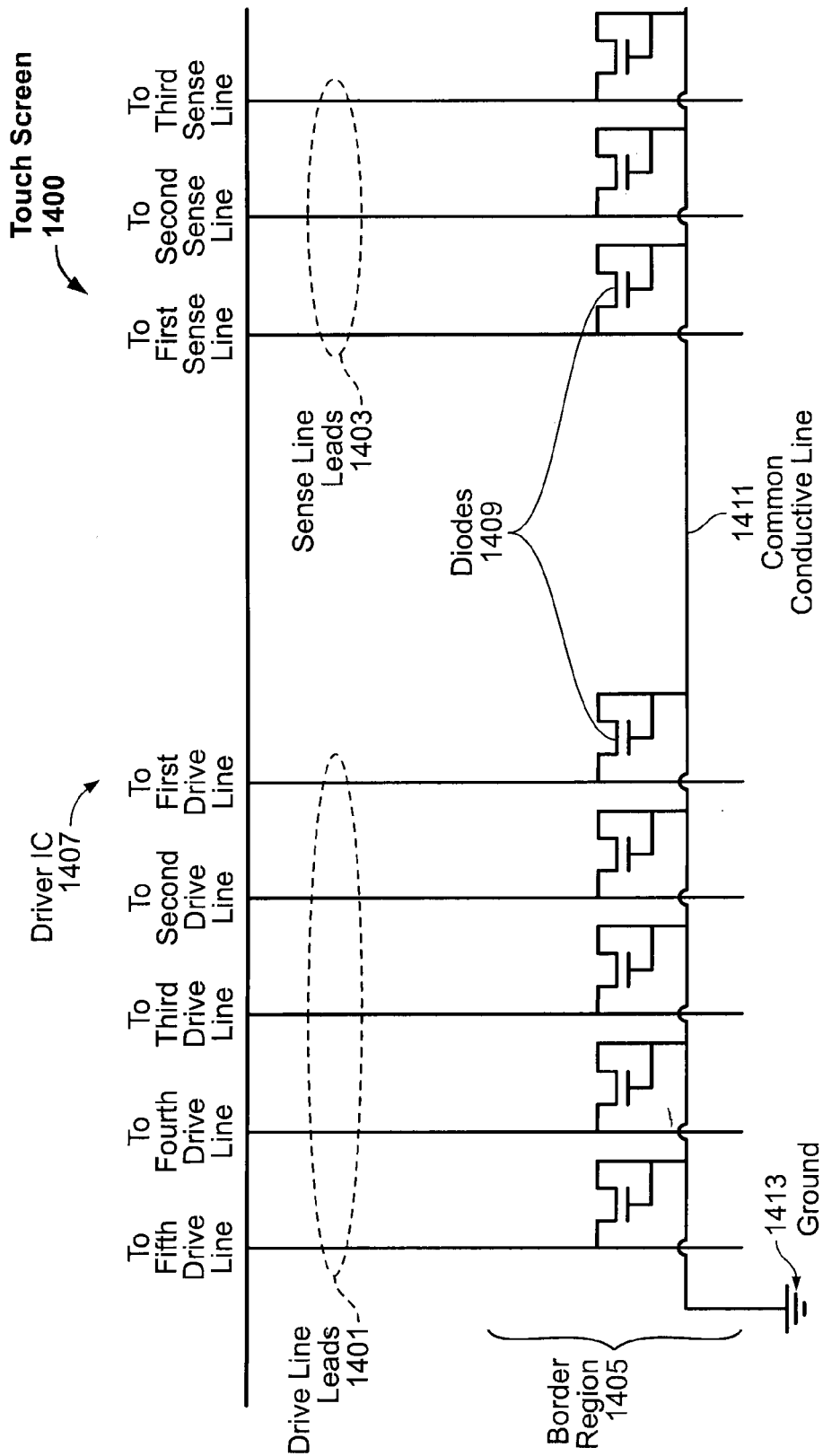

[0057] FIG. 14 illustrates a portion of a border region of an example touch screen according to various embodiments. A touch screen 1400 can include an active area with drive lines and sense lines (not shown) configured as described in example touch screen 800. Drive line leads 1401 and sense line leads 1403 can be configured as drive line leads 823 and sense line leads 825, respectively, and can run through a border region 1405 of touch screen 1400. A driver IC 1407 can be configured as driver IC 821 and can control the touch sensing operation of touch screen 1400.

Touch screen 1400 can include diodes 1409. Each diode 1409 can connect a single drive line lead 1401 to a common conductive line 1411, or can connect a single sense line lead 1403 to the common conductive line. Each diode 1409 can be configured such that the cathode is connected to the drive line or sense line and the anode is connected to common conductive line 1411, which can allow only a small diode leakage current to pass from the cathode to the anode of the diode.

Thus, each diode 1409 can provide a high-resistivity connection from the drive line or sense line to common conductive line 1411. In addition, common conductive line 1411 can be connected to an electrical ground 1413, such as a chassis ground, an earth ground, etc. In this regard, diodes 1409 can be configured to provide a high-resistivity connection from common conductive line 1411 to the drive lines and sense lines when the common conductive line (and hence the anode of each diode) is connected to ground.

Figure 18:
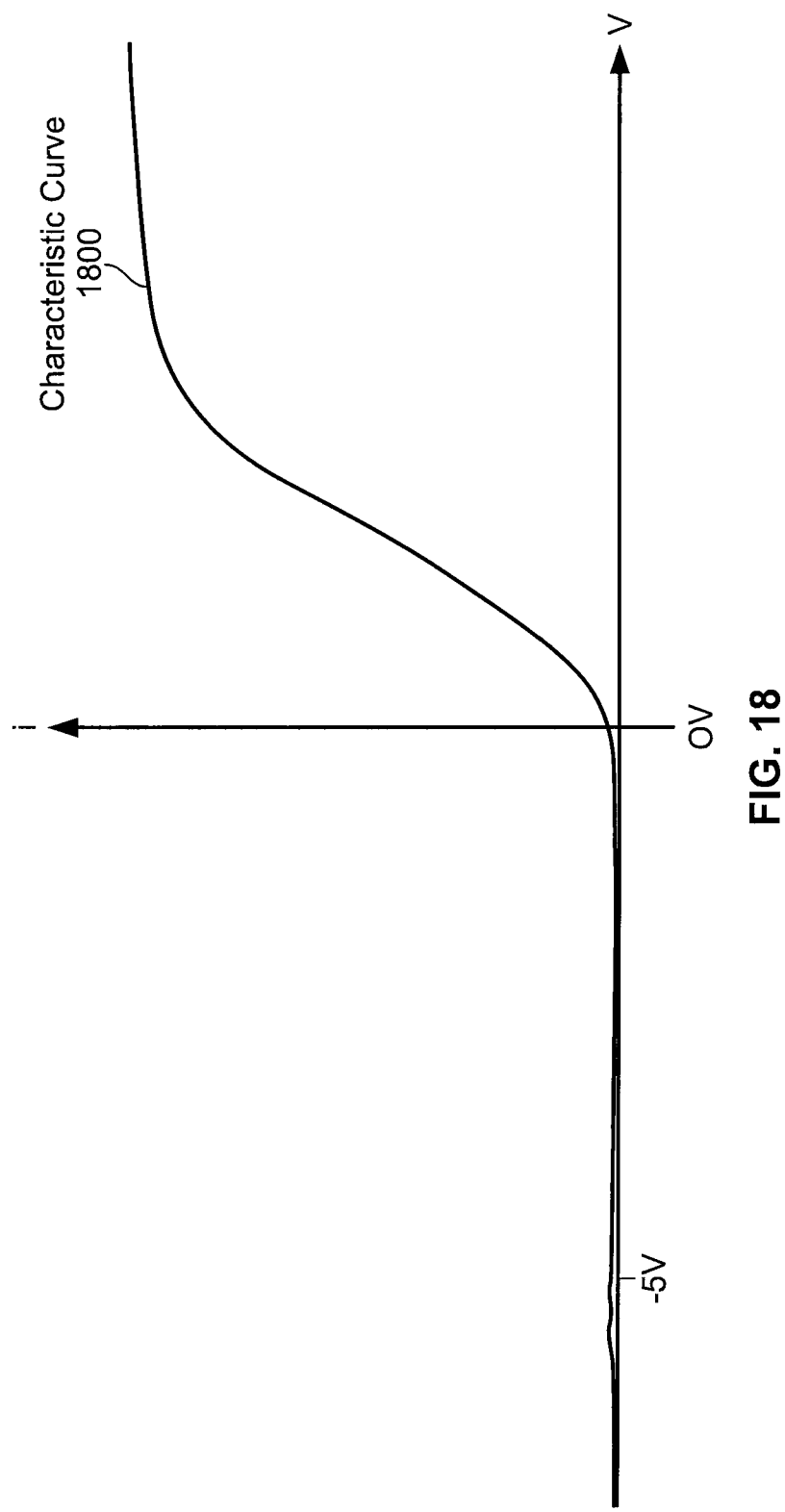
FIG. 18 illustrates a current versus voltage characteristic curve of an example diode that can be implemented according to various embodiments.

FIG. 18 illustrates an example current vs. voltage characteristic curve 1800 of diode 1409 according to various embodiments. At zero volts (e.g., ground) a forward current through diode 1409 can be very low, such that the diode can provide a high-resistivity connection from common conductive line 1411 to the drive lines and sense lines. It should be understood that charge leaking from the drive lines and the sense lines through diodes 1409 into common conductive line 1411 can flow to ground 1413 without causing a significant change in voltage at the anodes of the diodes. Consequently, charge flowing out of the drive and/or sense lines can flow to ground 1413. In this way, for example, a charge build up on one, multiple, or all of the drive lines and/or sense lines can be reduced or eliminated.

Figure 15:
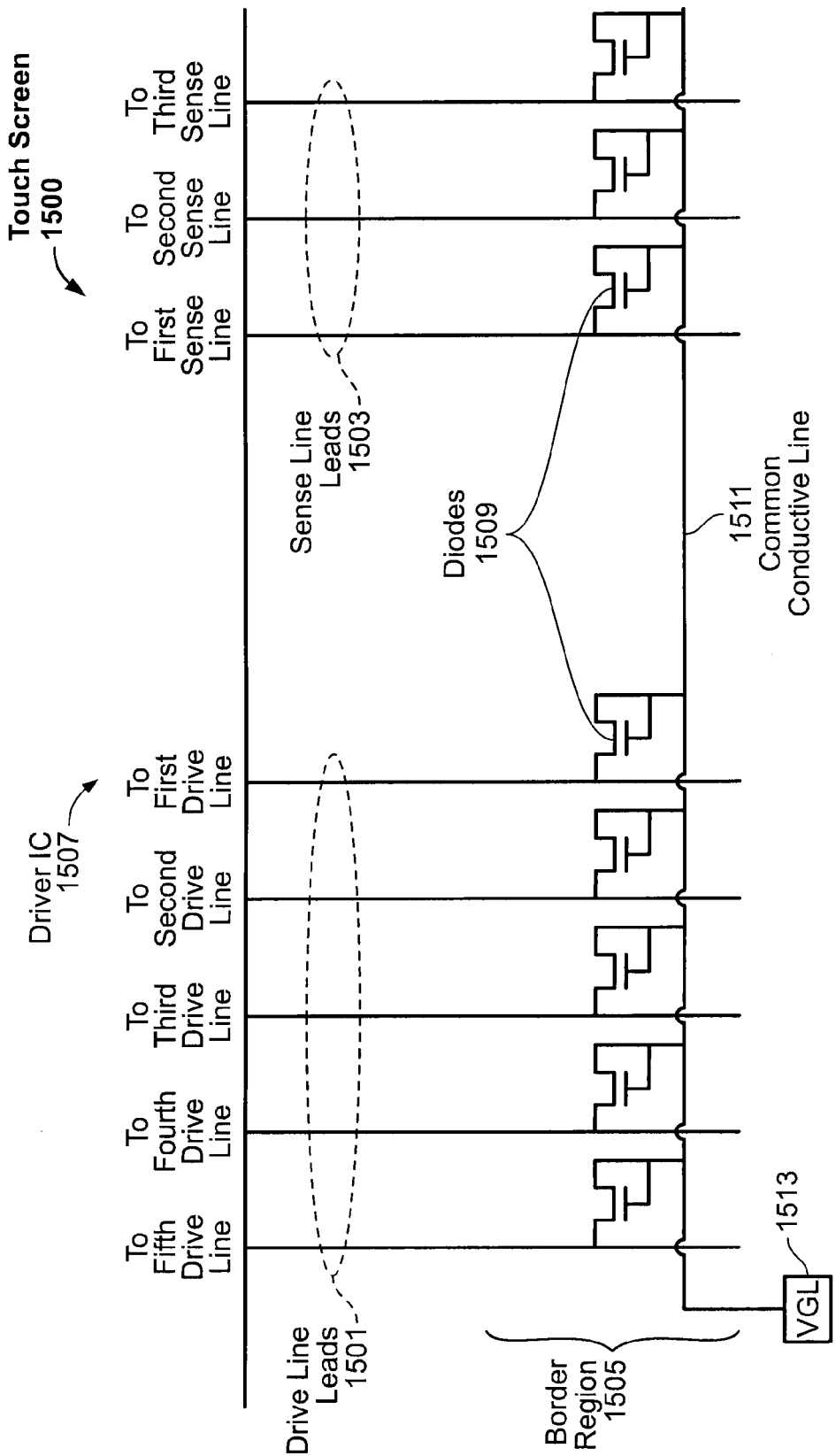

FIG. 15 illustrates a portion of a border region of an example touch screen according to various embodiments. A touch screen 1500 can include an active area with drive lines and sense lines (not shown) configured as described in example touch screen 800. Drive line leads 1501 and sense line leads 1503 can be configured as drive line leads 823 and sense line leads 825, respectively, and can run through a border region 1505 of touch screen 1500. A driver IC 1507 can be configured as driver IC 821 and can control the touch sensing operation of touch screen 1500.

Touch screen 1500 can include diodes 1509. Each diode 1509 can connect a single drive line lead 1501 to a common conductive line 1511, or can connect a single sense line lead 1503 to the common conductive line. Each diode 1509 can be configured such that the cathode is connected to the drive line or sense line and the anode is connected to common conductive line 1511. Thus, similar to the example configuration of FIG. 14, each diode 1509 of touch screen 1500 can provide a high-resistivity connection from the drive line or sense line to common conductive line 1511. In addition, common conductive line 1511 can be connected to a voltage source, such as a low gate line voltage source (VGL) 1513. VGL 1513 can be, for example, a shared voltage source that can supply voltage to multiple circuit elements of touch screen 1500. In this example, the voltage level of VGL 1513 can be fixed at −5V. Diodes 1509 can be configured to provide a high-resistivity connection from common conductive line 1511 to the drive lines and sense lines when the common conductive line (and hence the anode of each diode) is connected to a voltage of −5V. For example, diodes 1509 can have the current versus voltage characteristic curve illustrated in FIG. 18. Referring to FIG. 18, at a voltage level of −5V, a forward current through diode 1509 can be very low, such that the diode can provide a high-resistivity connection from common conductive line 1511 to the drive lines and sense lines. It should be understood that charge from a charge build up in one drive line or sense line can leak from the drive or sense line through the corresponding diode 1509 into common conductive line 1511, and can subsequently leak through one or more other diodes 1509 into other drive lines and sense lines. In this way, for example, a charge build up on one or more drive lines and/or sense lines can be distributed throughout all of the drive lines and sense lines.

Figure 16:
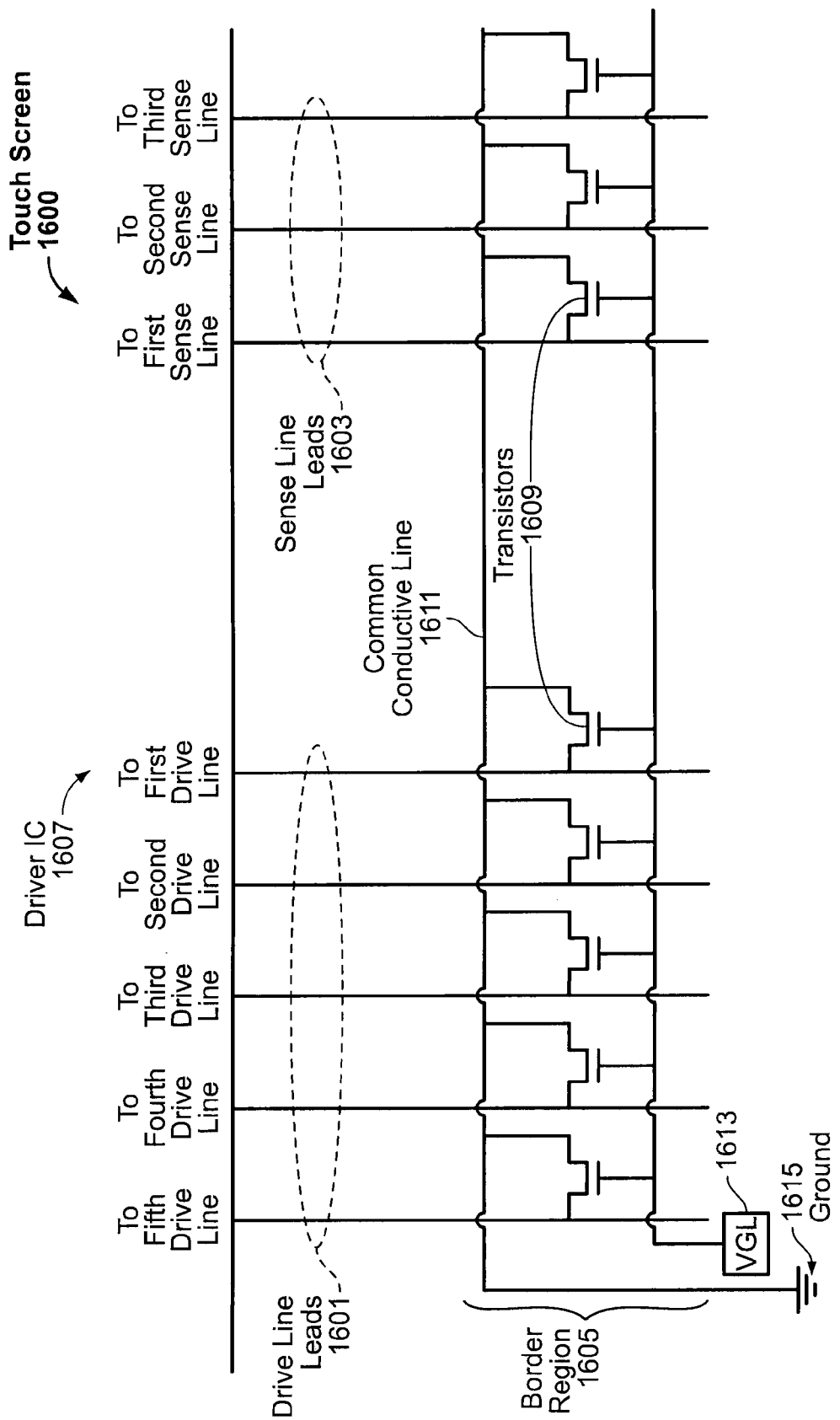

FIG. 16 illustrates a portion of a border region of an example touch screen according to various embodiments. A touch screen 1600 can include an active area with drive lines and sense lines (not shown) configured as described in example touch screen 800. Drive line leads 1601 and sense line leads 1603 can be configured as drive line leads 823 and sense line leads 825, respectively, and can run through a border region 1605 of touch screen 1600. A driver IC 1607 can be configured as driver IC 821 and can control the touch sensing operation of touch screen 1600.

Touch screen 1600 can include transistors 1609. The source of each transistor 1609 can be connected to a single drive line lead 1601 or to a single sense line lead 1603, and the drain of each of the transistors can be connected to a common conductive line 1611. The gates of each transistor 1609 can be connected to a voltage source, such as a low gate voltage source (VGL) 1613, which can be at a fixed voltage, such as −5V. Each transistor 1609 can be configured such that the voltage level of VGL 1613 applied to the gate of the transistor can maintain the transistor in the "off" state, which can allow only small transistor leakage current to pass from the source to the drain, or vice versa. Thus, each transistor 1609 of touch screen 1600 can provide a high-resistivity connection between a drive line and common conductive line 1611, or between a sense line and the common conductive line.

Common conductive line 1611 can be connected to an electrical ground 1613, such as a chassis ground, an earth ground, etc. Charge leaking from the drive lines and the sense lines through transistors 1609 into common conductive line 1611 can flow to ground 1613. In this way, for example, a charge build up on one, multiple, or all of the drive lines and/or sense lines can be reduced or eliminated.

Figure 17:
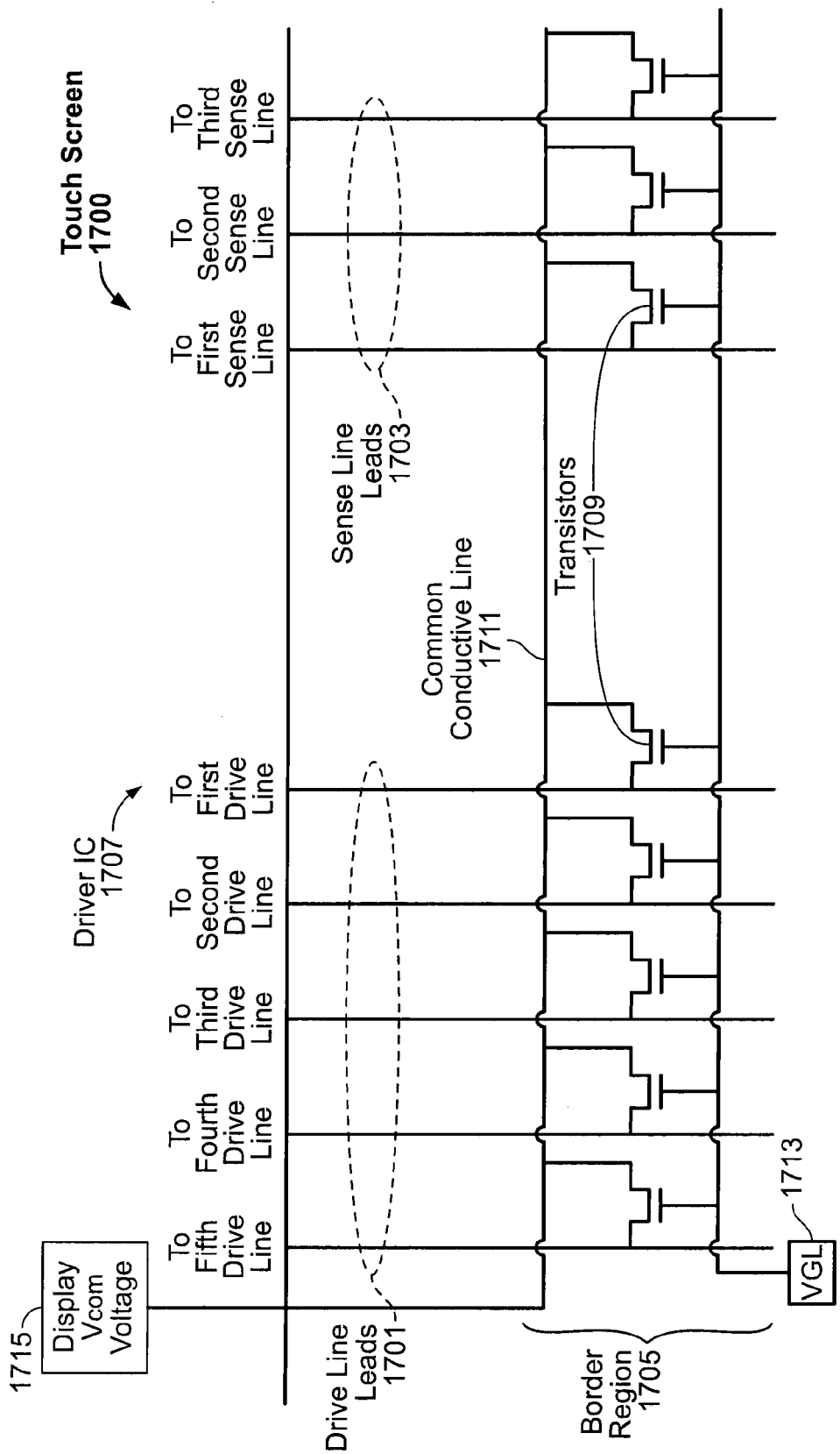

FIG. 17 illustrates a portion of a border region of an example touch screen according to various embodiments. A touch screen 1700 can include an active area with drive lines and sense lines (not shown) configured as described in example touch screen 800. Drive line leads 1701 and sense line leads 1703 can be configured as drive line leads 823 and sense line leads 825, respectively, and can run through a border region 1705 of touch screen 1700. A driver IC 1707 can be configured as driver IC 821 and can control the touch sensing operation of touch screen 1700.

Touch screen 1700 can include transistors 1709. The source of each transistor 1709 can be connected to a single drive line lead 1701 or to a single sense line lead 1703, and the drain of each of the transistors can be connected to a common conductive line 1711. The gates of each transistor 1709 can be connected to a voltage source, such as a low gate voltage source (VGL) 1713, which can be at a fixed voltage, such as −5V. Each transistor 1709 can be configured such that the voltage level of VGL 1713 applied to the gate of the transistor can maintain the transistor in the "off" state, which can allow only small transistor leakage current to pass from the source to the drain, or vice versa. Thus, each transistor 1709 of touch screen 1700 can provide a high-resistivity connection between a drive line and common conductive line 1711, or between a sense line and the common conductive line.

Common conductive line 1711 can be connected to a display Vcom voltage 1715. A voltage level of display Vcom voltage 1715 can be the voltage level applied to the Vcom during the display phase to display an image on touch screen 1700. Consequently, a charge build up on the Vcom of one of the drive or sense lines of touch screen 1700 can be spread to each of the other drive and sense lines by leaking through two transistors 1709, while display Vcom voltage 1715 can help maintain the desired voltage level on the Vcom portions of touch screen 1700.

Figure 19:
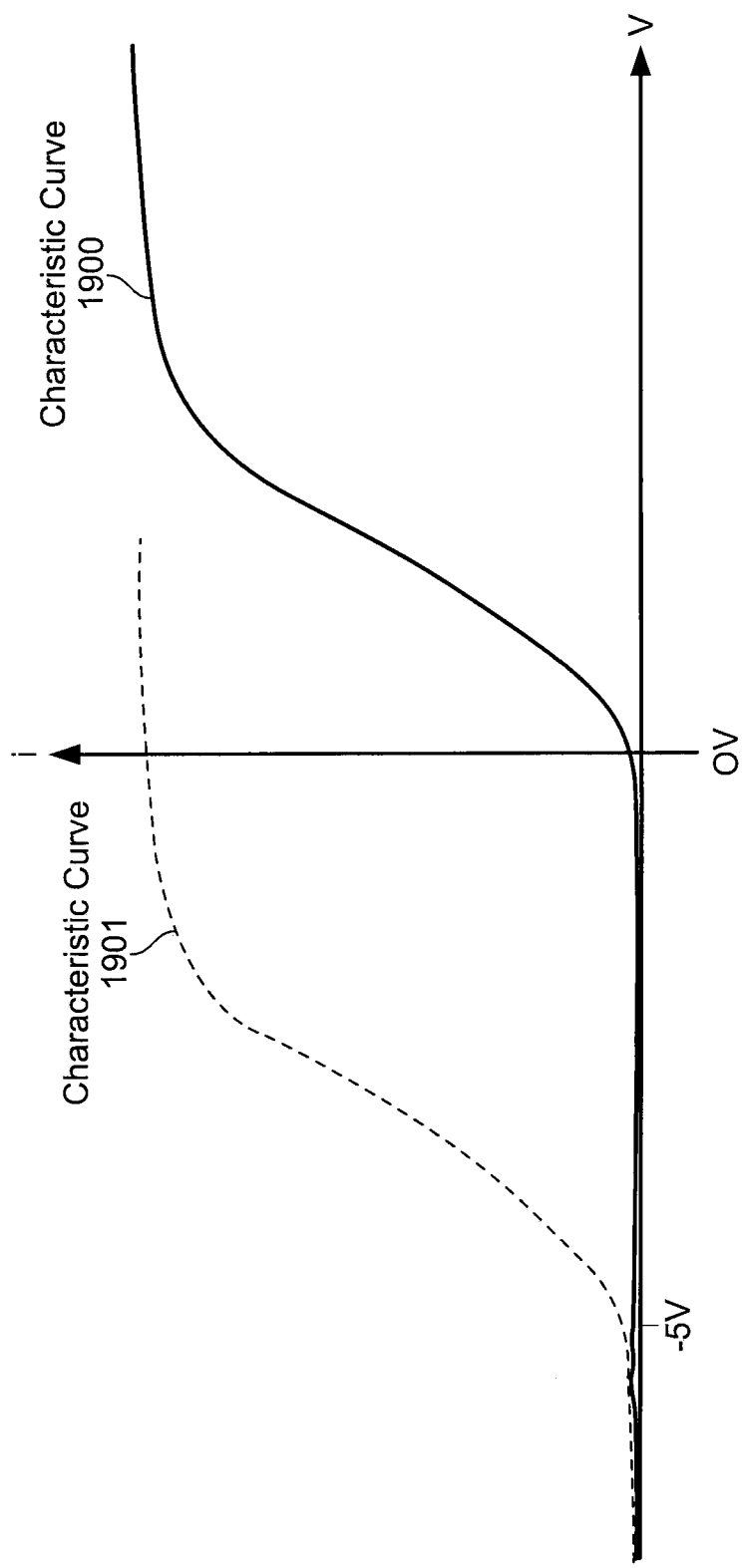
FIG. 19 illustrates current versus voltage characteristic curves of two example transistors that can be implemented according to various embodiments.

FIG. 19 illustrates current versus voltage characteristic curves of example transistors that can be implemented in high-resistivity connections according to various embodiments. For example, a transistor having a characteristic curve 1900 can be implemented as transistor 1609 or transistor 1709 in the example embodiments above. During operation of the example touch screens in these example embodiments, the gate of the transistor can be held at a voltage of −5 V, for example. As shown in characteristic curve 1900, a −5 V gate voltage can maintain the transistor in the off state, allowing the transistor to provide a high-resistivity for a high-resistivity connection. When the gate voltage of the transistor is maintained at zero volts, for example, the transistor also be in the off state as shown in characteristic curve 1900.

The gate voltage of the transistor can be zero volts in a variety of different situations. For example, the touch screen can be powered off occasionally during normal operational use. In another example, the gate voltage can be zero volts during the manufacture of the touch screen, e.g., when the gate voltage is electrically floating before the gate is connected to an active voltage source. Because a transistor having a characteristic curve 1900 would be in the off state during a power off situation, when the gate voltage is electrically floating, for example, any charge of a charge build up in one common electrode of the example touch screens would be required to leak through high-resistivity connection in order to spread to other common electrodes.

However, as will now be described in more detail, using a transistor having a characteristic curve 1901, for example, can allow charge spreading among common electrodes to occur more quickly during power off situations, when the gate voltage is electrically floating, etc. For example, a transistor having a characteristic curve 1901 can be implemented as transistor 1609 or transistor 1709 in the example embodiments above. During operation of the example touch screens in these example embodiments, the gate of the transistor can be held at a voltage of −5 V. As shown in characteristic curve 1901, a −5 V gate voltage can maintain the transistor in the off state, allowing the transistor to provide a high-resistivity for a high-resistivity connection. However, when the gate voltage of the transistor is zero volts, for example, the transistor can be in the on state as shown in characteristic curve 1901. Therefore, implementing a transistor having a characteristic curve that allows the transistor to be in the off state during operation of the touch screen and to be in the on state when the gate voltage of the transistor is zero volts can provide faster discharge and/or spreading of charge due to, for example, ESD.

Although embodiments of this disclosure have been fully described with reference to the accompanying drawings, it is to be noted that various changes and modifications including, but not limited to, combining features of different embodiments, omitting a feature or features, etc., as will be apparent to those skilled in the art in light of the present description and figures.

For example, although the foregoing example embodiments describe integrated touch screens in which Vcom portions can include drive lines and sense lines, one skilled in the art would readily understand that in some embodiments the Vcom portions can include only the drive lines, and that the sense lines can be disposed elsewhere, such as in a different material layer of the stackup. In this case, in some embodiments the sense lines can be dual-function elements that operate as part of the touch sensing circuitry and as part of the display circuitry, or while other embodiments, the sense lines can be single-function elements that operate as part of the touch sensing circuitry only. Likewise, in some embodiments, the Vcom portions can include only the sense lines, and the drive lines can be disposed elsewhere.

Furthermore, while the high-resistivity connections of example touch screen 700 are described as lines including high-resistivity material, it is to be understood that in some embodiments these high-resistivity connections can be diodes, transistors, etc., for example, as described in the example embodiments of FIGS. 14-19. It is also to be understood that various types of high-resistivity connections can be utilized in various embodiments as exclusive connections and/or non-exclusive connections, and can be formed within the active area of a touch screen, within the border region of a touch screen, and/or at a different location.

Also, while each drive line segment and sense line can be formed of a single Vcom that spans multiple display pixels in the various example embodiments, in some embodiments, each drive line segment and sense line can be formed of multiple, separate common electrodes that can be conductively connected together to form drive region segments and sense regions that generally correspond to drive line segments and sense lines. For example, in some embodiments each display pixel can include an individual Vcom, and a Vcom opening can exist between the Vcom each display pixel and the Vcoms of adjacent display pixels, such that the Vcoms are conductively isolated from each other in the Vcom layer of the pixel stackup. Multiple Vcoms can be conductively connected, for example, by conductive lines in an additional metal layer of the pixel stackup, such that the individual display pixel Vcoms can be electrically grouped to form drive line segments and sense lines. In these embodiments, high-resistivity connections can include high-resistivity connections between individual Vcoms in different drive lines and/or between a drive line and a sense line. In some embodiments, high-resistivity connections could include high-resistivity connections between the conductive lines connected to the individual Vcoms of the drive regions of different drive lines or between the drive region of a drive line and the sense region of a sense line.

While the each of the drive lines and sense lines in the various example embodiments are shown as generally rectangular regions of multiple Vcom portions or a single Vcom portion, respectively, the drive lines and sense lines are not limited to the shapes, orientations, and positions shown, but can include any suitable configurations as one skilled in the art would understand. For example, in some embodiments each drive line can be formed of a single Vcom portion, and each sense line can be formed of multiple sense line segments of Vcom that can be connected together with sense line links that bypass the drive lines. Furthermore, it is to be understood that the display pixels used to form the touch pixels are not limited to those described above, but can be any suitable size or shape to permit touch capabilities according to embodiments of the disclosure.

Although specific materials and types of materials may be included in the descriptions of example embodiments, one skilled in the art will understand that other materials that achieve the same function can be used. In some embodiments, the drive lines and/or sense lines can be formed of other elements including, for example other elements already existing in typical LCD displays (e.g., other electrodes, conductive and/or semiconductive layers, metal lines that would also function as circuit elements in a typical LCD display, for example, carry signals, store voltages, etc.), other elements formed in an LCD stackup that are not typical LCD stackup elements (e.g., other metal lines, plates, whose function would be substantially for the touch sensing system of the touch screen), and elements formed outside of the LCD stackup (e.g., such as external substantially transparent conductive plates, wires, and other elements). For example, part of the touch sensing system can include elements similar to known touch panel overlays.

In the foregoing example embodiments, each sub-pixels can be a red (R), green (G) or blue (B) sub-pixel, with the combination of all three R, G and B sub-pixels forming one color display pixel. Although this example embodiment includes red, green, and blue sub-pixels, a sub-pixel may be based on other colors of light or other wavelengths of electromagnetic radiation (e.g., infrared) or may be based on a monochromatic configuration.

What is claimed is:

1. An integrated touch screen comprising:
   a plurality of display pixels disposed in an active region of the touch screen;
   a plurality of common electrodes including first common electrodes and second common electrodes, each display pixel being associated with one of the common electrodes, wherein the first common electrodes are sense common electrodes and the second common electrodes are drive common electrodes;
   a plurality of first connections between the sense common electrodes or between the drive common electrodes, each first connection conductively connecting two of the sense common electrodes or two of the drive common electrodes; and
   a plurality of second connections between one of the sense common electrodes and one of the drive common electrodes, each second connection conductively connecting two of the common electrodes comprising one of the sense common electrodes and one of the drive common electrodes and configured to allow a charge to leak through the second connection when the touch screen is powered on, wherein each second connection has a resistivity higher than each first connection.

2. The integrated touch screen of claim 1, further comprising: a pixel material associated with each display pixel, wherein the pixel material is liquid crystal.

3. The integrated touch screen of claim 1, further comprising: a stackup of material layers, the stackup including the plurality of display pixels, wherein one or more of the first or second connections connecting common electrodes includes a first material disposed in the stackup.

4. The integrated touch screen of claim 3, wherein the first material is disposed in a same material layer of the stackup as the common electrodes.

5. The integrated touch screen of claim 3, wherein the first material is disposed in a different material layer than the common electrodes.

6. The integrated touch screen of claim 1, wherein one or more of the second connections connecting common electrodes is an exclusive connection between two of the common electrodes.

7. The integrated touch screen of claim 1, further comprising:
   a border region adjacent to the active region, the border region including no display pixels; and
   a plurality of conductive leads, each conductive lead connected to one of the common electrodes, and at least a portion of each conductive lead being disposed in the border region.

8. The integrated touch screen of claim 7, wherein one or more of the connections between common electrodes includes one or more second connections between the conductive leads in the border region.

9. The integrated touch screen of claim 8, wherein the one or more second connections between two of the conductive leads includes a line.

10. The integrated touch screen of claim 8, further comprising:
    a common conductive line, at least a portion of the common conductive line being disposed in the border region, wherein the plurality of conductive leads includes first, second, and third conductive leads conductively connected to third, fourth, and fifth common electrodes included in the plurality of first or second common electrodes, respectively, and each of the first, second, and third conductive leads is conductively connected to the common conductive line through a connection between the conductive line and the conductive lead, such that the connection between the third and fourth common electrodes includes two connections between the conductive line and the first and second conductive leads, and the connection between the fourth and fifth common electrodes includes two connections between the conductive line and the second and third conductive leads.

11. The integrated touch screen of claim 10, further comprising: a ground conductively connected to the conductive line.

12. The integrated touch screen of claim 10, further comprising:
    a plurality of data lines, wherein each display pixel includes a pixel electrode and the pixel electrode is electrically connected to one of the data lines;
    a display driver that controls voltages of the data lines and the common electrodes to apply a voltage to the pixel material associated with each display pixel, wherein a luminance of each display pixel is controlled based on an amount of the voltage applied to the pixel material, and
    wherein the display driver controls a voltage of the common electrodes by setting the voltage of the common electrodes to a first voltage value, the integrated touch screen further comprising:
       a display common electrode voltage source that supplies a voltage at the first voltage value, wherein the conductive line is conductively connected to the display common electrode voltage source.

13. The integrated touch screen of claim 10, wherein one or more of the connections between the conductive line and the conductive lead includes a diode.

14. The integrated touch screen of claim 13, wherein the anode of each of the one or more diodes is conductively connected to the conductive line, the integrated touch screen further comprising:
    a voltage source electrically connected to the conductive line, wherein a voltage level of the voltage source restricts current from the anode to the cathode of the diode, such that the diode operates as a connection from the conductive line to the conductive lead.

15. The integrated touch screen of claim 14, wherein the voltage source includes one of a ground and a fixed voltage source.

16. The integrated touch screen of claim 10, wherein one or more of the connections between the conductive line and the conductive lead includes a transistor, wherein the source and drain of the transistor are conductively connected to the conductive line and the conductive lead, and the gate of the transistor is electrically connected to a first voltage source that supplies a first voltage to the gate of the transistor, the first voltage maintaining the transistor in the off state, such that the transistor operates as the connection between the conductive line and the conductive lead.

17. The integrated touch screen of claim 16, further comprising: a ground conductively connected to the conductive line.

18. The integrated touch screen of claim 12, wherein the display driver controls the voltage of the common electrodes by setting the voltage of the common electrodes to a second voltage value, the integrated touch screen further comprising:
   a display common electrode voltage source that supplies a voltage at the second voltage value, wherein the conductive line is conductively connected to the display common electrode voltage source.

19. The integrated touch screen of claim 16, wherein the source and drain of each of the one or more transistors are conductively connected to the conductive lead and conductive line, respectively, and wherein the transistor is in the on state at a gate voltage of zero volts.

20. The integrated touch screen of claim 12, further comprising:
   a touch controller that applies drive signals to one or more of the common electrodes and that receives sense signals resulting from the drive signals, the sense signals indicating an amount of touch on the touch screen, wherein each conductive lead electrically connects one of the common electrodes to at least one of the display driver and the touch controller.

21. The integrated touch screen of claim 1, wherein the sense signals are generated on one or more of the common electrodes.

* * * * *